US008750055B2

(12) United States Patent
Kim et al.

(10) Patent No.: US 8,750,055 B2
(45) Date of Patent: Jun. 10, 2014

(54) NONVOLATILE MEMORY DEVICE, READ METHOD FOR NONVOLATILE MEMORY DEVICE, AND MEMORY SYSTEM INCORPORATING NONVOLATILE MEMORY DEVICE

(75) Inventors: Chul Bum Kim, Seoul (KR); Hyung Gon Kim, Hwaseong-si (KR); Chul Ho Lee, Suwon-si (KR); Hong Seok Chang, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 262 days.

(21) Appl. No.: 13/295,357

(22) Filed: Nov. 14, 2011

(65) Prior Publication Data

US 2012/0120741 A1 May 17, 2012

(30) Foreign Application Priority Data

Nov. 15, 2010 (KR) ........................ 10-2010-0113468

(51) Int. Cl.
*G11C 7/22* (2006.01)

(52) U.S. Cl.
USPC ............ 365/189.14; 365/189.15; 365/189.16; 365/193

(58) Field of Classification Search
USPC .................. 365/189.14, 189.15, 189.16, 193
See application file for complete search history.

(56) References Cited

U.S. PATENT DOCUMENTS

| | | | | |
|---|---|---|---|---|
| 5,986,959 | A | 11/1999 | Itou | |
| 6,538,924 | B2 * | 3/2003 | Dono et al. | 365/185.08 |
| 7,542,354 | B2 * | 6/2009 | Chun et al. | 365/185.33 |
| 7,554,849 | B2 * | 6/2009 | Honma et al. | 365/185.21 |
| 7,821,837 | B2 * | 10/2010 | Chun et al. | 365/185.22 |
| 7,929,350 | B2 * | 4/2011 | Hwang | 365/185.19 |
| 8,059,464 | B2 * | 11/2011 | Kwak et al. | 365/185.18 |

FOREIGN PATENT DOCUMENTS

| | | |
|---|---|---|
| JP | 10-228769 | 8/1998 |
| KR | 10-0266117 | 6/2000 |
| KR | 1020010027123 A | 4/2001 |
| KR | 1020080107559 A | 12/2008 |

* cited by examiner

*Primary Examiner* — Pho M Luu
(74) *Attorney, Agent, or Firm* — Volentine & Whitt, PLLC

(57) ABSTRACT

A method of performing a read operation on nonvolatile memory device comprises receiving a read command, receiving addresses, detecting a transition of a read enable signal, generating a strobe signal based on the transition of the read enable signal, reading data corresponding to the received addresses, and outputting the read data after the strobe signal is toggled a predetermined number of times.

20 Claims, 19 Drawing Sheets

NONVOLATILE MEMORY DEVICE, READ METHOD FOR NONVOLATILE MEMORY DEVICE, AND MEMORY SYSTEM INCORPORATING NONVOLATILE MEMORY DEVICE

CROSS-REFERENCE TO RELATED APPLICATIONS

This application claims priority under 35 U.S.C. §119 to Korean Patent Application No. 10-2010-0113468 filed on Nov. 15, 2010, the disclosure of which is hereby incorporated by reference in its entirety.

BACKGROUND OF THE INVENTION

Embodiments of the inventive concept relate generally to semiconductor memory devices, and more particularly to nonvolatile memory devices, read methods for the nonvolatile memory devices, and memory systems incorporating the nonvolatile memory devices.

Semiconductor memory devices can be roughly divided into two categories according to whether they retain stored data when disconnected from power. These categories include volatile memory devices, which lose stored data when disconnected from power, and nonvolatile memory devices, which retain stored data when disconnected from power. Examples of volatile memory devices include dynamic random access memory (DRAM) and static random access memory (SRAM). Examples of nonvolatile memory devices include read only memory (ROM), programmable read only memory (PROM), electrically programmable read only memory (EPROM), electrically erasable and programmable read only memory (EEPROM), flash memory, phase-change random access memory (PRAM), magnetic random access memory (MRAM), resistive random access memory (RRAM), and ferroelectric random access memory (FRAM).

Flash memory device is an especially popular type of nonvolatile memory device due to attractive features such as relatively high storage capacity, low power consumption, and the ability to withstand physical shock. In view of this continuing popularity, researchers are constantly pursuing ways to improve flash memory devices. For example, researchers are continually pursuing ways to improve the speed and accuracy of read and write operations as well as storage capacity.

SUMMARY OF THE INVENTION

According to one embodiment of the inventive concept, a method of reading a nonvolatile memory device comprises receiving a read command, receiving addresses, detecting a transition of a read enable signal, generating a strobe signal based on the transition of the read enable signal, reading data corresponding to the received addresses, and outputting the read data after the strobe signal is toggled a predetermined number of times.

According to another embodiment of the inventive concept, a nonvolatile memory device comprises a memory cell array, an address decoder that selects a word line of the memory cell array in response to a received addresses, a clock generator that generates a clock based on a read enable signal, a read and write circuit that reads data corresponding to the received addresses from the memory cell array and transfers the read data in response to the clock, and an input/output driver that outputs a strobe signal in response to the read enable signal and outputs the read data transferred from the read and write circuit. The read data is output after the strobe signal is toggled a predetermined number of times.

According to still another embodiment of the inventive concept, a memory system comprises a nonvolatile memory device, and a controller configured to control the nonvolatile memory device. The nonvolatile memory device comprises a memory cell array, an address decoder that selects a word line of the memory cell array in response to received addresses, a clock generator that generates a clock based on a read enable signal, a read and write circuit that reads data corresponding to the received addresses from the memory cell array and transfers the read data in response to the clock, and an input/output driver that outputs a strobe signal in response to the read enable signal and outputs the read data transferred from the read and write circuit. The read data is output after the strobe signal is toggled a predetermined number of times.

These and other embodiments of the inventive concept can improve the reliability of a nonvolatile memory device by outputting an input/output signal after a strobe signal is stabilized.

BRIEF DESCRIPTION OF THE DRAWINGS

The drawings illustrate selected embodiments of the inventive concept. In the drawings, like reference numbers indicate like features.

DETAILED DESCRIPTION

Figure 1:
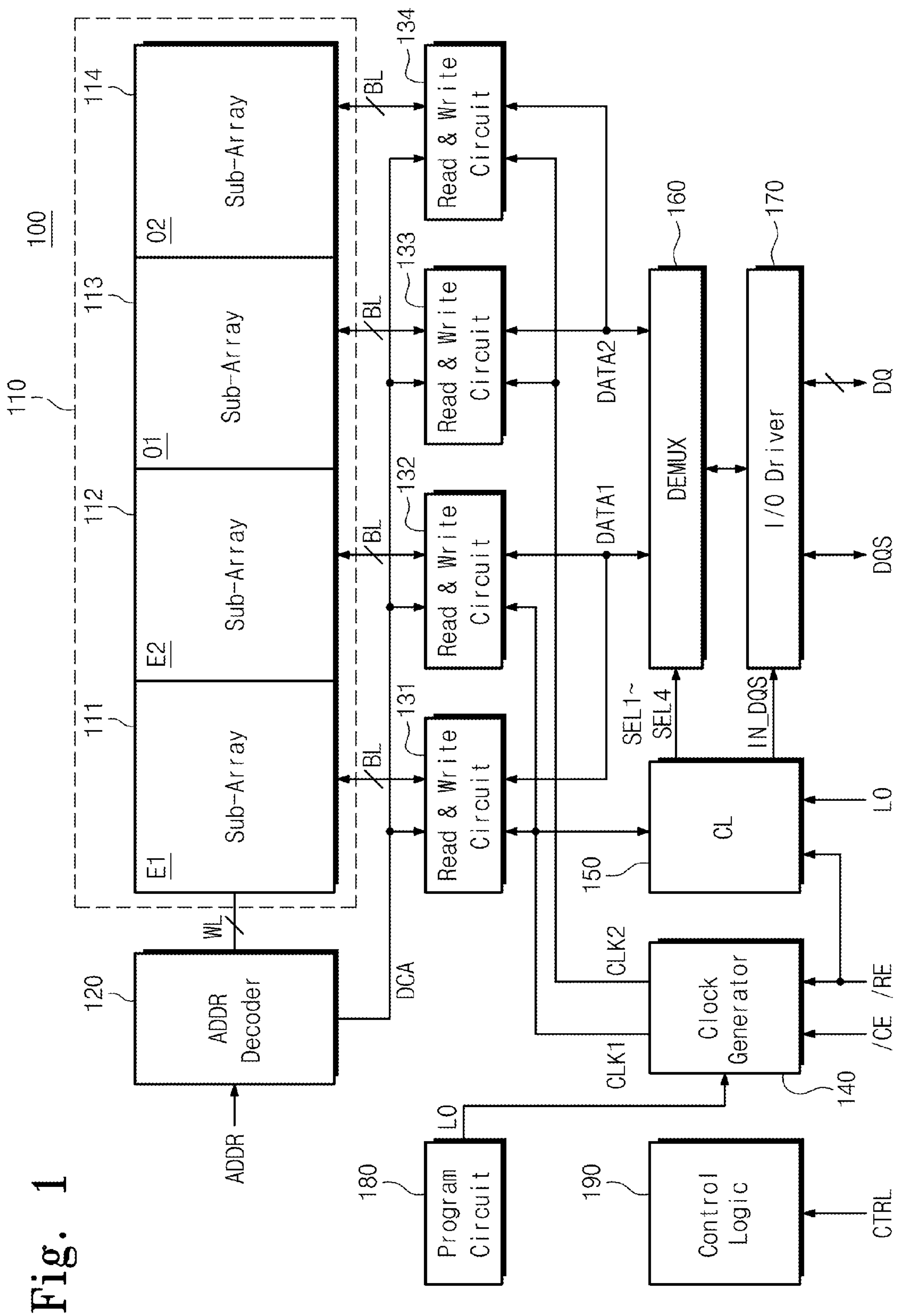
FIG. 1 is a block diagram of a nonvolatile memory device according to a first embodiment of the inventive concept.

Embodiments of the inventive concept are described below with reference to the accompanying drawings. These embodiments are presented as teaching examples and should not be construed to limit the scope of the inventive concept.

In the description that follows, the terms first, second, third etc. are used to describe various features, but the described features should not be limited by these terms. Rather, these terms are merely used to distinguish between different features. Thus, a first feature could be termed a second feature without departing from the teachings of the inventive concept.

Spatially relative terms such as "beneath", "below", "lower", "under", "above", and "upper" may be used herein for ease of description to describe feature's relationship to another feature as illustrated in the figures. The spatially relative terms are intended to encompass different orientations of the device in use or operation in addition to the orientation depicted in the figures. For example, if the device in the figures is turned over, features described as "below" or "beneath" or "under" other features would then be oriented "above" the other features. Thus, the terms "below" and "under" can encompass both an orientation of above and below. A device can be otherwise oriented (rotated 90 degrees or at other orientations) and the spatially relative descriptors used herein interpreted accordingly. In addition, where a feature is referred to as being "between" two features, it can be the only feature between the two features, or one or more intervening features may also be present.

The terminology used herein is for the purpose of describing particular embodiments only and is not intended to be limiting of the inventive concept. As used herein, the singular forms "a", "an" and "the" are intended to encompass the plural forms as well, unless the context clearly indicates otherwise. The terms "comprises" and/or "comprising" specify the presence of stated features, but do not preclude the presence or addition of one or more additional features. As used herein, the term "and/or" indicates any and all combinations of one or more of the associated listed items.

Where a feature is referred to as being "on", "connected to", "coupled to", or "adjacent to" another feature, it can be directly on, connected, coupled, or adjacent to the other feature, or intervening features may be present. In contrast, where a feature is referred to as being "directly on," "directly connected to", "directly coupled to", or "immediately adjacent to" another feature, there are no intervening features present.

Unless otherwise defined, all terms (including technical and scientific terms) used herein have the same meaning as commonly understood by one of ordinary skill in the art. Terms such as those defined in commonly used dictionaries should be interpreted as having a meaning that is consistent with their meaning in the context of the relevant art and/or the present specification and will not be interpreted in an idealized or overly formal sense unless expressly so defined herein.

The term "chip enable signal" is used to refer to a "chip enable signal" CE or an "inverted chip enable signal"/CE. Chip enable signal /CE is defined as a signal that is activated where a chip is selected. For example, an activated chip enable signal /CE may have a first level, and an inactivated chip enable signal /CE may have a second level.

The term "read enable signal" is used to refer to a "read enable signal" RE and an "inverted read enable signal"/RE. Read enable signal /RE is defined as a signal that is activated in a read operation. For example, an activated read enable signal /RE may have a level that transitions iteratively, and an inactivated read enable signal /RE may have a fixed level.

Certain embodiments of the inventive concept are described below with reference to a flash memory device. However, the inventive concept is not limited to flash memory device, and could be implemented with other types of memories, such as MRAM, FRAM, PRAM, ROM, PROM, EPROM, and EEPROM, to name but a few.

FIG. 1 is a block diagram of a nonvolatile memory device according to a first embodiment of the inventive concept.

Referring to FIG. 1, a nonvolatile memory device 100 comprises a memory cell array 110, an address decoder 120, first through fourth read and write circuits 131 through 134, a clock generator 140, a combination logic 150, a de-multiplexer 160, an input/output driver 170, a program circuit 180, and control logic 190.

Memory cell array 110 comprises first through fourth sub-arrays 111 through 114, each of which comprises a plurality of memory cells. The plurality of memory cells are connected with address decoder 120 via word lines WL and with first through fourth read and write circuits 131 through 134 via bit lines BL.

Memory cell array 110 is not limited to being formed of first through fourth sub-arrays 111 through 114. For example, it is possible to form memory cell array 110 with one or more sub-arrays. The memory cells can be arranged in a two-dimensional (2D) array structure or a three-dimensional (3D) array structure. An example of a 3D array structure is disclosed in U.S. Publication No. 2008-0023747, entitled "SEMICONDUCTOR MEMORY DEVICE WITH MEMORY CELLS ON MULTIPLE LAYERS", and U.S. Publication No. 2008-0084729, entitled "SEMICONDUCTOR DEVICE WITH THREE-DIMENSIONAL ARRAY STRUCTURE", the respective disclosures of which are hereby incorporated by reference in their entirety.

Address decoder 120 is connected with first through fourth sub-arrays 111 through 114 via word lines WL. Address decoder 120 receives an address ADDR and decodes a row address and a column address from the received address ADDR. Address decoder 120 selects a word line using the decoded row address, and transfers a decoded column address DCA to first through fourth read and write circuits 131 through 134. Address decoder 120 can comprise, for instance, a row decoder, a column decoder, or an address buffer.

First through fourth read and write circuits 131 through 134 are connected to first through fourth sub-arrays 111 through 114 via bit lines BL. More specifically, first read and write circuit 131 is connected to first sub-array 111, second read and write circuit 132 is connected to second sub-array 112, third read and write circuit 133 is connected to third sub-array 133, and fourth read and write circuit 134 is connected to fourth sub-array 114.

First through fourth read and write circuits 131 through 134 are connected with de-multiplexer 160 via first and second data paths DATA1 and DATA2. First and second read and write circuits 131 and 132 are connected to de-multiplexer 160 via first data path DATA1, and third and fourth read and write circuits 133 and 134 are connected to de-multiplexer 160 via second data path DATA2.

First and second read and write circuits 131 and 132 are configured to read data corresponding to address ADDR from first and second sub-arrays 111 and 112, and then transfer the read data to de-multiplexer 160 in response to a first clock CLK1. First and second read and write circuits 131 and 132 typically comprise data latches (not shown) connected with first data path DATA1, and they are configured to store the read data in the data latches (not shown). The data latches (not shown) are configured to store data in response to first clock CLK1.

Third and fourth read and write circuits 133 and 134 are configured to read data corresponding to address ADDR from third and fourth sub-arrays 113 and 114, and then transfer the read data to de-multiplexer 160 in response to a second clock CLK2. Third and fourth read and write circuits 133 and 134 typically comprise data latches (not shown) connected with second data path DATA2, and they are configured to store the read data in the data latches (not shown). The data latches (not shown) are configured to store data in response to second clock CLK2.

First through fourth read and write circuits 131 through 134 can write data in first through fourth sub-arrays 111 through 114, and they can also read data from first through fourth sub-arrays 111 through 114 and then write the read data back into first through fourth sub-arrays 111 through 114 in a copy-back operation.

Clock generator 140 receives a chip enable signal /CE and a read enable signal /RE from an external device, and it receives a latency option LO from program circuit 180. Clock generator 140 generates first clock CLK1 and second clock CLK2 based on chip enable signal /CE, read enable signal /RE, and latency option LO.

First clock CLK1 is sent to first and second read and write circuits 131 and 132 and combination logic 150. Second clock CLK2 is sent to third and fourth read and write circuits 133 and 134.

Second clock CLK2 is an inverted version of first clock CLK1. First and second clocks CLK1 and CLK2 have a period that is longer than a duration for which read enable signal /RE is toggled. For example, first and second clocks CLK1 and CLK2 can have a period twice as long as the duration for which read enable signal /RE is toggled.

Combination logic 150 receives read enable signal /RE from an external device, and it receives first clock CLK1 from clock generator 140. Combination logic 150 generates first through fourth selection signals SEL1 through SEL4 and a strobe ready signal IN_DQS based on read enable signal /RE and first clock CLK1. Combination logic 150 receives latency option LO from program circuit 180 and generates first through fourth selection signals SEL1 through SEL4 based on latency option LO.

Combination logic 150 alternately inactivates or activates all of first through fourth selection signals SEL1 through SEL4. Combination logic 150 generates strobe ready signal IN_DQS with the same waveform as read enable signal /RE.

De-multiplexer 160 is connected with first through fourth read and write circuits 131 through 134 via first and second data paths DATA1 and DATA2. De-multiplexer 160 receives first through fourth selection signals SEL1 through SEL4 from combination logic 150, and it connects any one of first through fourth read and write circuits 131 through 134 to input/output driver 170 in response to first through fourth selection signals SEL1 through SEL4. More specifically, de-multiplexer 160 connects first read and write circuit 131 to input/output circuit 170 in response to first selection signal SEL1, it connects second read and write circuit 132 to input/output circuit 170 in response to second selection signal SEL2, it connects third read and write circuit 133 to input/output circuit 170 in response to third selection signal SEL3, and it connects fourth read and write circuit 134 to input/output circuit 170 in response to fourth selection signal SEL4.

Input/output driver 170 exchanges a strobe signal DQS and an input/output signal DQ with the external device, and it exchanges data with de-multiplexer 160. In a write operation, input/output driver 170 transfers input/output signal DQ received from the external device to first through fourth read and write circuits 131 through 134 via de-multiplexer 160. In a read operation, input/output driver 170 outputs data received via de-multiplexer 160 from first through fourth read write circuits 131 through 134 to the external device as input/output signal DQ.

In a read operation, input/output driver 170 receives strobe ready signal IN_DQS from combination logic 150. Input/output driver 170 outputs strobe signal DQS to the external device in response to strobe ready signal IN_DQS. Strobe signal DQS has the same waveform as strobe ready signal IN_DQS and is a signal delayed by a predetermined time.

Program circuit 180 stores latency option LO and provides latency option LO to clock generator 140. Latency option LO comprises information for controlling the timing of first and second clocks CLK1 and CLK2. Typically, latency option LO determines the timing of first and second clocks CLK1 and CLK2 based on strobe signal DQS or read enable signal /RE. For example, latency option LO can determine to generate first and second clocks CLK1 and CLK2 beginning a predetermined number of cycles after activation of read enable signal /RE.

Program circuit 180 comprises a circuit capable of storing data. For example, program circuit 180 may be programmed a mode register set (MRS) or a feature set command. Program circuit 180 typically comprises at least one of a layer fuse, an electrical fuse, and nonvolatile memory cells.

Control logic 190 controls operations of nonvolatile memory device 100. For example, control logic 190 can control operations of elements 111 through 114, 120, 131 through 134, and 140 through 180. Control logic 190 operates in response to a control signal CTRL received from the external device. Although not illustrated in FIG. 1, control logic 190 can further receive chip enable signal /CE and read enable signal /RE.

Figure 2:
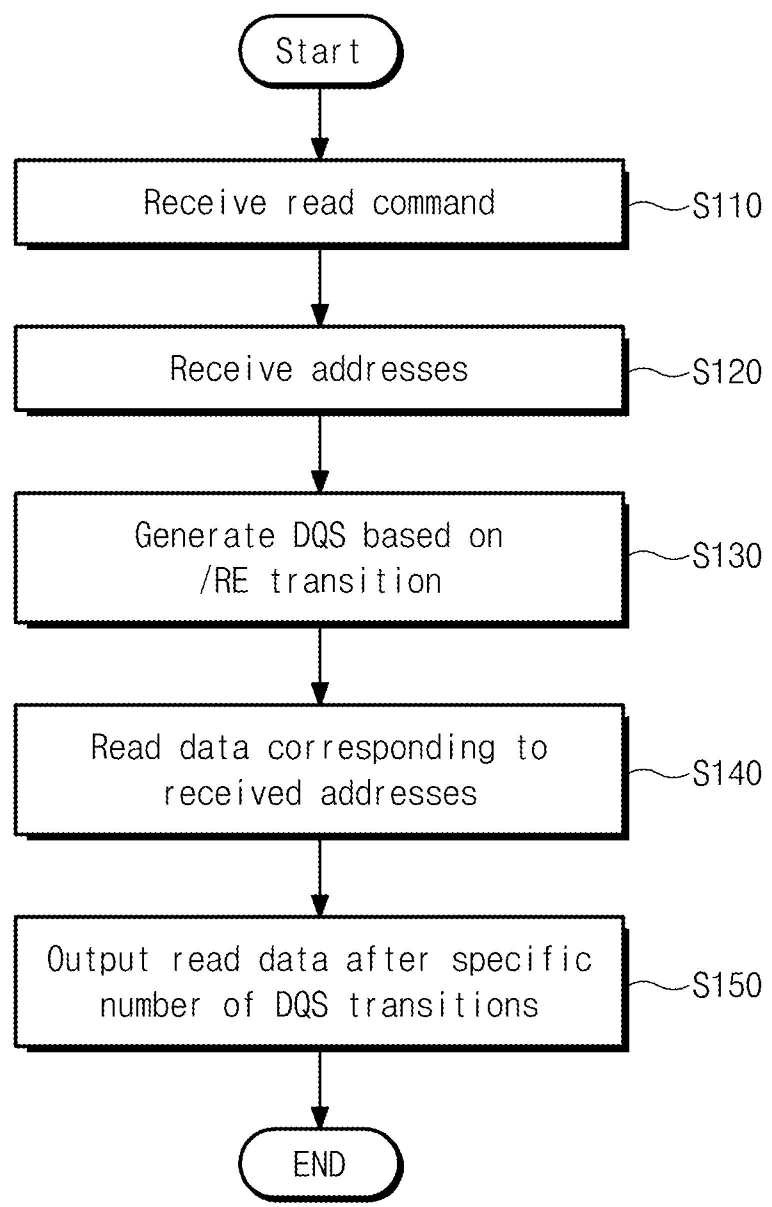
FIG. 2 is a flowchart illustrating a method of performing a read operation in a nonvolatile memory device according to an embodiment of the inventive concept.

FIG. 2 is a flowchart illustrating a method of performing a read operation in nonvolatile memory device 100 according to an embodiment of the inventive concept. In the description that follows, example method steps will be indicated by parentheses to distinguish them from example system or device features.

Referring to FIG. 2, nonvolatile memory device 100 receives a read command (S110). For example, the read command can be sent to control logic 190 in the form of control signal CTRL. Then, in response to the received read command, control logic 190 can control first through fourth sub-arrays 111 through 114, an address decoder 120, first through fourth read and write circuits 131 through 134, a clock generator 140, combination logic 150, a de-multiplexer 160, an input/output driver 170, and a program circuit 180.

Next, nonvolatile memory device 100 receives an address ADDR (S120). Address ADDR is sent to address decoder 120, which decodes the received address ADDR. Although steps S110 and S120 are shown in sequence, these steps can be performed in a reverse order or simultaneously. Additionally, multiple read commands and addresses can be received in various alternative sequences.

Next, a strobe signal DQS is generated based on transitions of a read enable signal /RE (S130). For example, combination logic 150 can generate a strobe ready signal IN_DQS, which has the same waveform as a toggled read enable signal /RE and is delayed by a predetermined time, in response to the toggled read enable signal DQS. In some examples, strobe ready signal IN_DQS is delayed by half a period of read enable signal /RE. In other examples, strobe ready signal IN_DQS is synchronized with read enable signal /RE. Input/output driver 170 generates strobe signal DQS based on strobe ready signal IN_DQS.

Thereafter, nonvolatile memory device 100 outputs read data from a location corresponding to address ADDR (S140). For example, the first through fourth read and write circuits 131 through 134 read data corresponding to the received address ADDR from first through fourth sub-arrays 111 through 114.

After strobe signal DQS transitions a predetermined number of times, the read data is transferred to an external device (S150). For example, first through fourth read and write circuits 131 through 134 can transfer the read data to de-multiplexer 160 after strobe signal DQS transitions a predetermined number of times. De-multiplexer 160 selectively connects first through fourth read and write circuits 131 through 134 to input/output driver 170. Input/output driver 170 outputs data transferred from first through fourth read and write circuits 131 through 134 as an input/output signal DQ.

Figure 3:
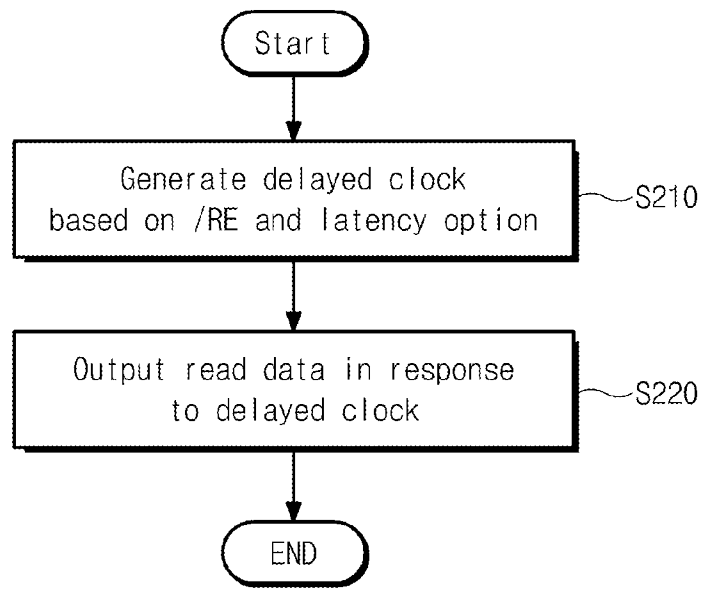
FIG. 3 is a flowchart illustrating a method of outputting read data from the nonvolatile memory device of FIG. 1 according to an embodiment of the inventive concept.

FIG. 3 is a flowchart illustrating a method of outputting read data from nonvolatile memory device 100 according to an embodiment of the inventive concept. The method of FIG. 3 corresponds to step S150 of FIG. 2.

Referring to FIG. 3, a delay clock is generated based on a toggled read enable signal /RE and latency option LO (S210). Clock generator 140 generates first and second clocks CLK1 and CLK2 after a transition of read enable signal /RE is detected and read enable signal /RE is toggled a number of times corresponding to latency option LO. First and second clocks CLK1 and CLK2 can be synchronized with any one of a rising edge and a falling edge of a toggled read enable signal /RE.

Next, data corresponding to a received column address starts to be output according to the delayed clock (S220). That is, first through fourth read and write circuits 131 through 134 transfer read data to de-multiplexer 160 in response to first and second clocks CLK1 and CLK2. De-multiplexer 160 sends data provided from first through fourth read and write circuits 131 through 134 to input/output driver 170. That is, data read by first through fourth read and write circuits 131 through 134 can be provided to the external device in response to first and second clocks CLK1 and CLK2 which are delayed by a predetermined time based on strobe signal DQS. As a result, read data is provided to the external device after a predetermined clock cycle based on strobe signal DQS.

Figure 4:
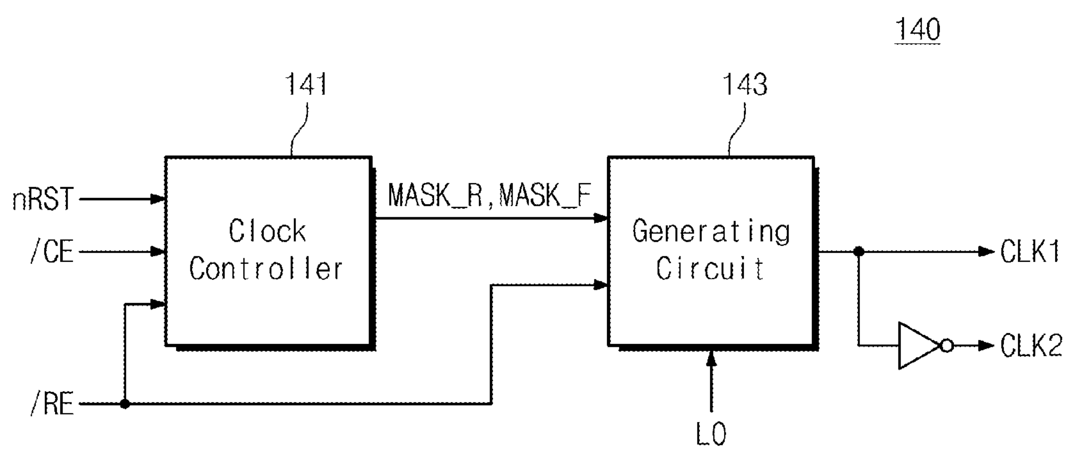
FIG. 4 is a block diagram of a clock generator illustrated in FIG. 1 according to an embodiment of the inventive concept.

FIG. 4 is a block diagram of clock generator 140 of FIG. 1 according to an embodiment of the inventive concept.

Referring to FIG. 4, clock generator 140 comprises a clock controller 141 and a clock generating circuit 143. Clock controller 141 receives chip enable signal /CE and read enable signal /RE and generates rising mask signals MASK_R and falling mask signals MASK_F in response to chip enable signal /CE and read enable signal /RE.

Rising mask signals MASK_R are activated in synchronization with rising edges of a toggled read enable signal /RE. For example, rising mask signals MASK_R can be activated in synchronization with first through m-th rising edges of the toggled read enable signal /RE. One or more rising mask signals MASK_R can also remain in an active state for a longer duration.

Falling mask signals MASK_F are activated in synchronization with falling edges of toggled read enable signal /RE. For example, falling mask signals MASK_F can be activated in synchronization with first through m-th falling edges of toggled read enable signal /RE. One or more falling mask signals MASK_F can also remain in an active state for a longer duration.

Clock generating circuit 143 receives latency option LO, read enable signal /RE, rising mask signals MASK_R, and falling mask signals MASK_F. Clock generating circuit 143 generates first clock CLK1 and second clock CLK2 in response to read enable signal /RE being toggled. The timing of first clock CLK1 is determined in response to one of the rising and falling mask signals MASK_R and MASK_F. Second clock CLK2 is an inverted version of first clock CLK1.

Figure 5:
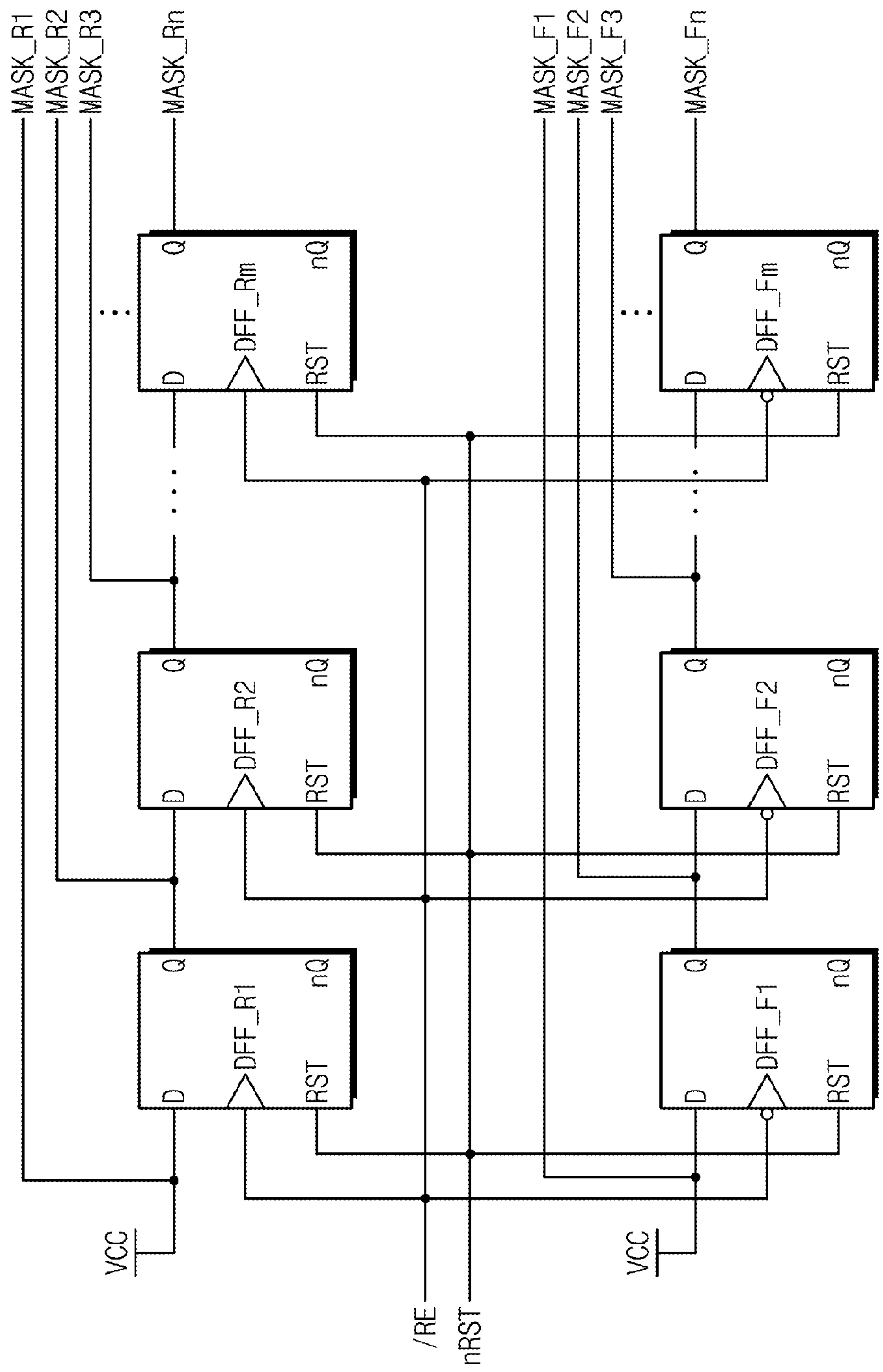
FIG. 5 is a block diagram of a clock controller illustrated in FIG. 4 according to an embodiment of the inventive concept.

FIG. 5 is a block diagram of clock controller 141 illustrated in FIG. 4 according to an embodiment of the inventive concept.

Referring to FIG. 5, clock controller 141 comprises rising flip-flops DFF_R1 through DFF_Rm and falling flip-flops DFF_F1 through DFF_Fm. Rising flip-flops DFF_R1 through DFF_Rm are connected in series. In particular, an output node Q of the (k−1)-th rising flip-flop DFF_R(k−1) ($1<k<m+1$) is connected with an input node D of the k-th rising flip-flop DFF_Rk.

A signal on output node Q of the k-th rising flip-flop DFF_Rk is provided as the (k+1)-th rising mask signal MASK_R(k+1). An input node D of the first rising flip-flop DFF_R1 is connected with a power supply voltage VCC. A signal on input node D of the rising flip-flop DFF_R1 is provided as the first rising mask signal MASK_R1. That is, a signal on input node D of the first rising flip-flop DFF_R1 and signals on output nodes Q of the rising flip-flops DFF_R1 through DFF_Rm are provided as the first to n-th rising mask signals MASK_R1 through MASK_Rn ($n>m$).

Rising flip-flops DFF_R1 through DFF_Rm operate responsive to read enable signal /RE. Rising flip-flops DFF_R1 through DFF_Rm operate in synchronization with a rising edge of read enable signal /RE being toggled. At a first rising edge of the toggled read enable signal /RE, a signal on an input node D of first rising flip-flop DFF_R1 is transferred to an output node Q thereof. That is, power supply voltage VCC is sent to output node Q of first rising flip-flop DFF_R1 at the first rising edge of the toggled read enable signal /RE.

At a second rising edge of the toggled read enable signal /RE, a signal on an input node D of second rising flip-flop DFF_R2 is transferred to an output node Q thereof. That is, power supply voltage VCC is sent to output node Q of second rising flip-flop DFF_R2 at the second rising edge of the toggled read enable signal /RE.

Likewise, at a k-th rising edge of the toggled read enable signal /RE, power supply voltage VCC is sent to output node Q of k-th rising flip-flop DFF_Rk. That is, first rising mask signal MASK_R1 is always in an active state, and k-th rising mask signal MASK_Rk is activated at a (k+1)-th rising edge of read enable signal /RE being toggled.

Rising flop-flops DFF_R1 through DFF_Rm are reset by a reset signal nRST, which is activated in response to chip enable signal /CE. For example, reset signal nRST can be activated simultaneously where chip enable signal /CE is activated. Alternatively, reset signal nRST can be activated after chip enable signal /CE is activated. That is, where a following read operation is performed after a read operation is ended, rising mask signals MASK_R2 through MASK_Rn are inactivated. Reset signal nRST is generated by clock controller 141 in response to chip enable signal /CE.

Falling flip-flops DFF_F1 through DFF_Fm are connected in series. An output node Q of (k−1)-th falling flip-flop DFF_F(k−1) is connected with an input node D of k-th falling flip-flop DFF_Fk.

Falling flip-flops DFF_F1 through DFF_Fm are configured to operate responsive to an inverted version of read enable signal /RE. Falling flip-flops DFF_F1 through DFF_Fm typically operate in synchronization with a falling edge of the toggled read enable signal /RE.

Falling flip-flops DFF_F1 through DFF_Fm operate the same as rising flip-flops DFF_R1 through DFF_Rm except that they operate in response to an inverted version of read enable signal /RE. That is, first falling mask signal MASK_F1 is always in an active state. The k-th falling mask signal MASK_Fk is activated in synchronization with (k−1)-th falling edge of the toggled read enable signal /RE. Where a following read operation is performed after a read operation is ended, falling mask signals MASK_F2 to MASK_Fn are inactivated.

Figure 6:
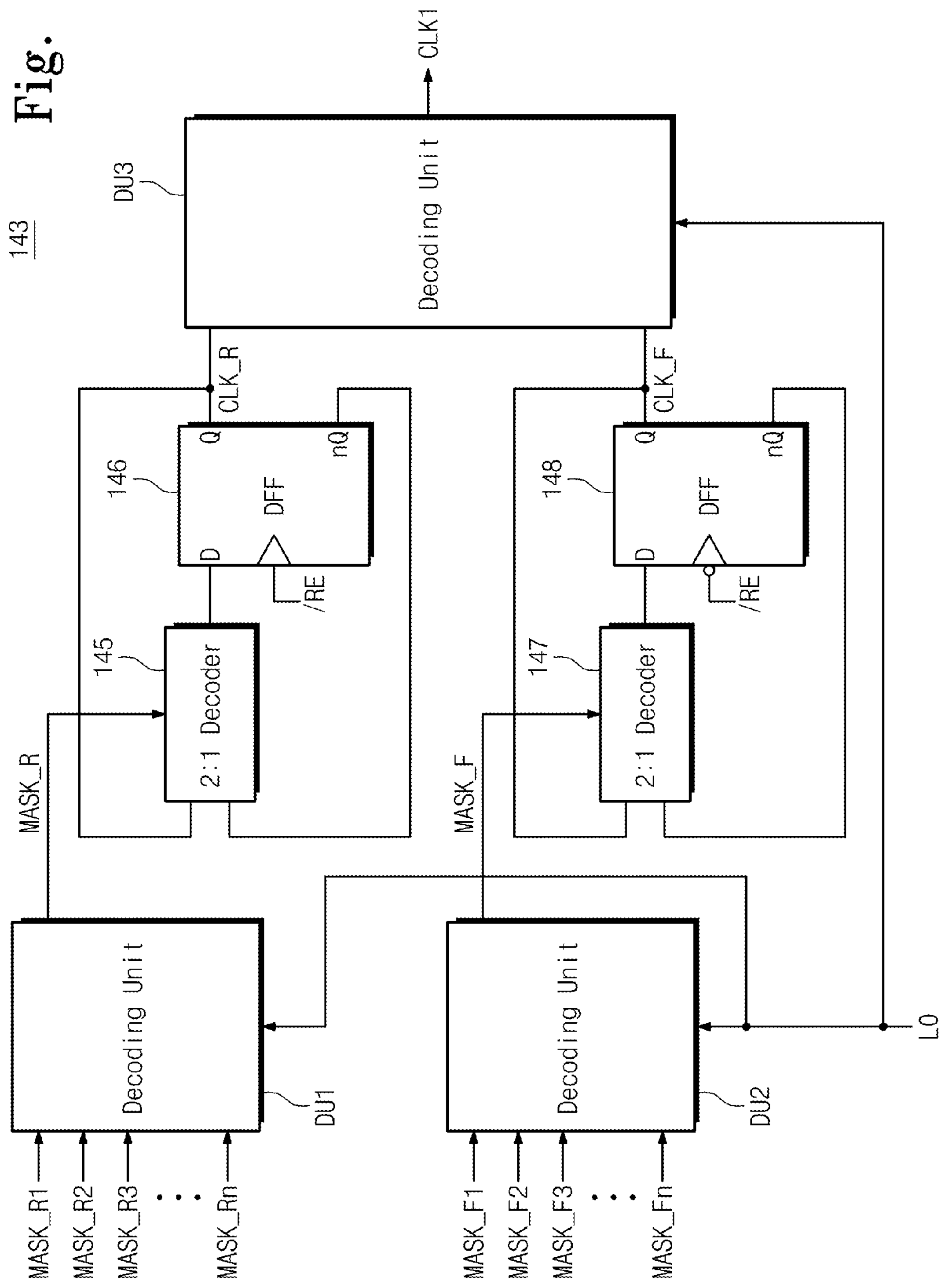
FIG. 6 is a block diagram of a clock generating circuit illustrated in FIG. 4 according to an embodiment of the inventive concept.

FIG. 6 is a block diagram of clock generating circuit 143 illustrated in FIG. 4 according to an embodiment of the inventive concept.

Referring to FIG. 6, clock generating circuit 143 comprises first through third decoding units DU1 through DU3, first and second decoders 145 and 147, and first and second flip-flops 146 and 148. In the description that follows, clocks generated according to first through n-th rising mask signals MASK_R1 through MASK_Rn are called first through n-th rising clocks CLK_R1 through CLK_Rn, and clocks generated according to first through n-th falling mask signals MASK_F1 through MASK_Fn are called first through n-th falling clocks CLK_F1 through CLK_Fn.

First decoding unit DU1 receives first through n-th rising mask signals MASK_R1 through MASK_Rn. First decoding unit DU1 selects one of first through n-th rising mask signals MASK_R1 through MASK_Rn in response to latency option LO. A selected mask signal is transferred to first decoder 145 as rising mask signal MASK_R.

Second decoding unit DU2 receives first through n-th falling mask signals MASK_F1 through MASK_Fn. Second decoding unit DU2 selects one of the first through n-th falling mask signals MASK_F1 through MASK_Fn in response to latency option LO. A selected mask signal is transferred to second decoder 147 as a falling mask signal MASK_F.

First decoder 145 operates in response to rising mask signal MASK_R. First decoder 145 can operate in response to any one of rising mask signals MASK_R1 through MASK_Rn. Where rising mask signal MASK_R is activated, first decoder 145 connects an output node Q of first flip-flop 146 with an input node D thereof. Where rising mask signal MASK_R is inactivated, first decoder 145 connects an inverted output node nQ of first flip-flop 146 with input node D thereof.

Input node D of first flip-flop 146 is connected to first decoder 145, and it operates in response to read enable signal /RE. Output nodes Q and nQ of first flip-flop 146 are connected with first decoder 145. A signal on output node Q of first flip-flop 146 is used as rising clock CLK_R.

Second decoder 147 operates in response to falling mask signal MASK_F. Second decoder 147 can operate in response to any one of falling mask signals MASK_F1 through MASK_Fn. Where falling mask signal MASK_F is activated, second decoder 147 connects an output node Q of second flip-flop 148 with an input node D thereof. Where falling mask signal MASK_F is inactivated, second decoder 147 connects an inverted output node nQ of second flip-flop 148 with input node D thereof.

Input node D of second flip-flop 148 is connected to second decoder 147, and it operates in response to an inverted version of read enable signal /RE. Output nodes Q and nQ of second flip-flop 148 are connected with second decoder 147. A signal on output node Q of second flip-flop 148 is used as a falling clock CLK_F.

Third decoding unit DU3 receives rising clock CLK_R and falling clock CLK_F. Third decoding unit DU3 selects any one of rising and falling clocks CLK_R and CLK_F in response to latency option LO. The selected clock is used as first clock CLK1. As illustrated in FIG. 4, second clock CLK2 is generated by inverting first clock CLK1 using an inverter.

Figure 7:
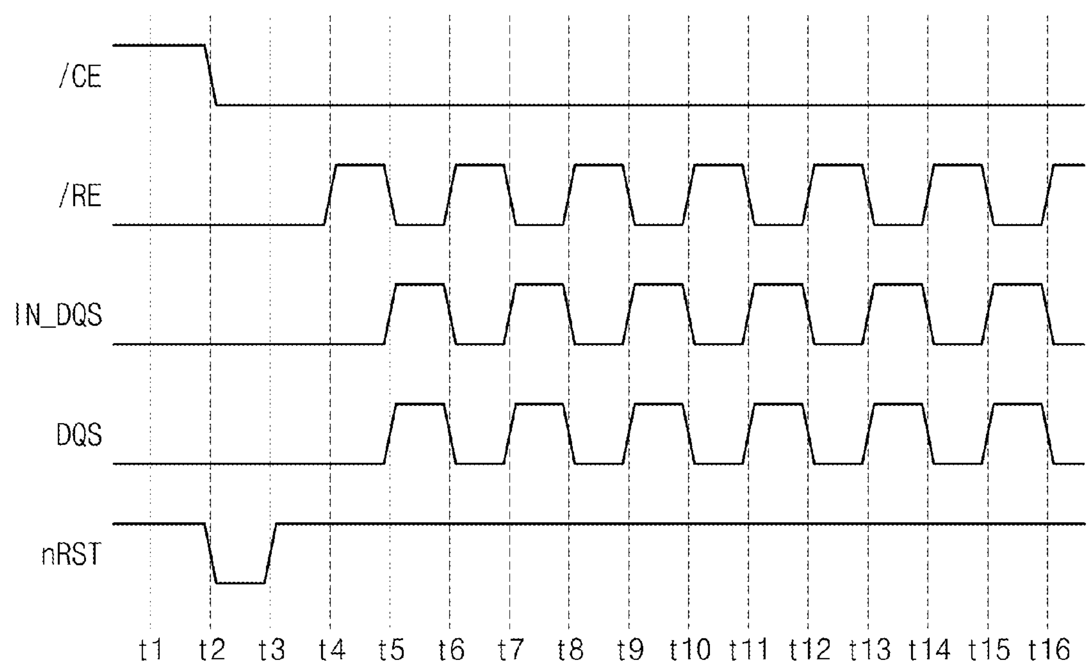
FIG. 7 is a first timing diagram for describing operations of the nonvolatile memory device of FIG. 1 according to an embodiment of the inventive concept.

FIG. 7 is a first timing diagram for describing operations of nonvolatile memory device 100 according to an embodiment of the inventive concept. In the description that follows, operations for generating strobe signal DQS will be more fully described with reference to FIGS. 1 and 3 through 7.

Referring to FIG. 7, at a time t2, chip enable signal /CE is activated to select nonvolatile memory device 100, and reset signal nRST is generated in response to the activation of chip enable signal /CE. Consequently, at time t2, rising and falling flip-flops DFF_R1 through DFF_Rm and DFF_F1 through DFF_Rm of clock controller 141 are reset by reset signal nRST.

Next, at a time t4, read enable signal /RE starts to be toggled. That is, at time t4, a transition of read enable signal /Re is detected. Combination logic 150 generates strobe ready signal IN_DQS with the same waveform as read enable signal /RE but delayed by a predetermined time on the basis of read enable signal /RE. Input/output driver 170 responds to strobe ready signal IN_DQS to generate a strobe signal DQS with the same waveform as strobe ready signal IN_DQS. Accordingly, at time t4, input/output driver 170 outputs strobe signal DQS being toggled.

Figure 8:
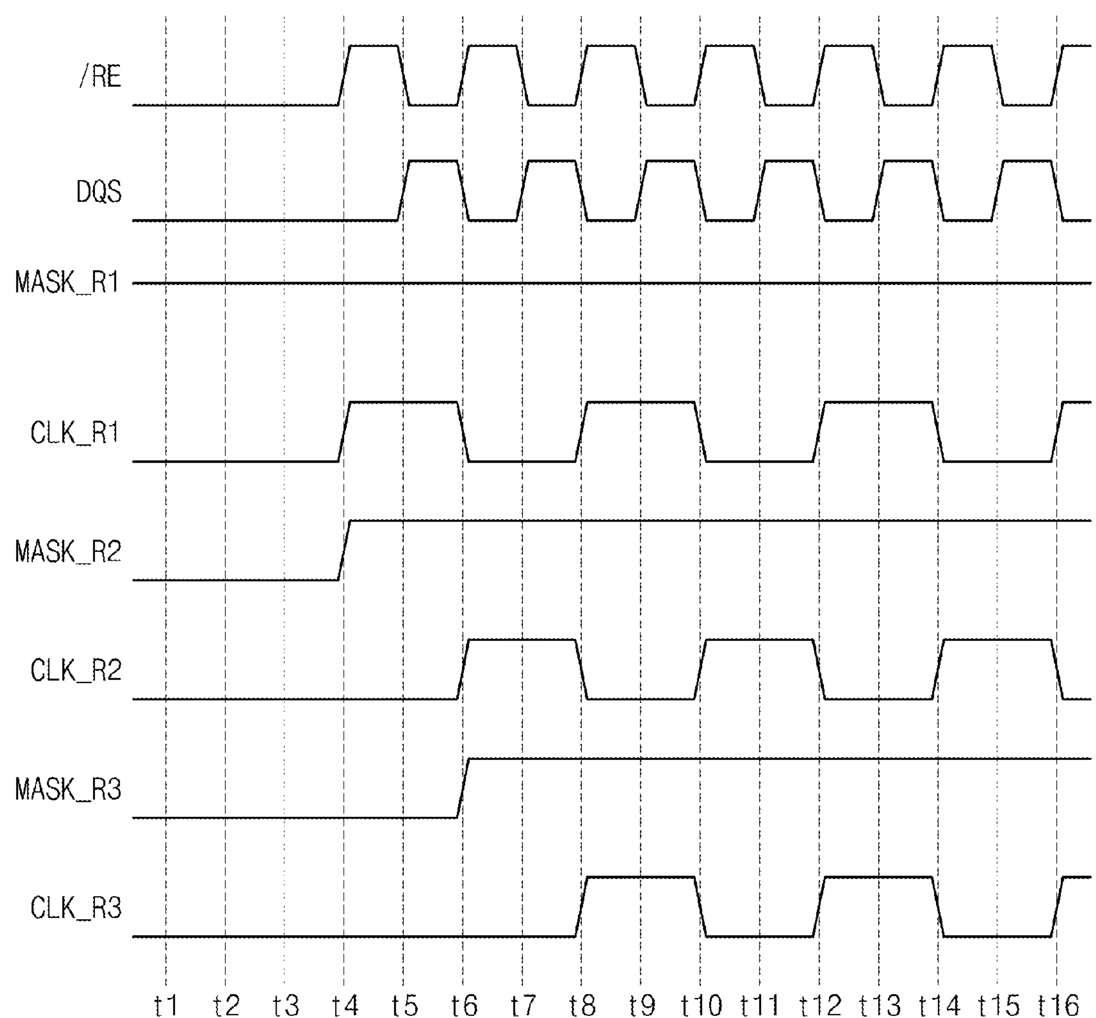
FIG. 8 is a second timing diagram for describing operations of the nonvolatile memory device of FIG. 1 according to an embodiment of the inventive concept.

FIG. 8 is a second timing diagram for describing operations of nonvolatile memory device 100 according to an embodiment of the inventive concept.

Referring to FIGS. 1 and 3 to 8, read enable signal /RE is toggled from time t4. A first rising mask signal MASK_R1 is output from a clock controller 141 with a high level. Accordingly, where first rising mask signal MASK_R1 is provided to first decoder 145 via first decoding unit DU1, an input node D of first flip-flop 146 is electrically connected with an inverted output node nQ. Initially, a signal on input node D of first flip-flop 146 is at a low level, a signal on an output node Q thereof is at the low level, and a signal on an inverted node nQ thereof is at the high level.

Read enable signal /RE transitions from the low level to the high level at time t4, and a high-level signal on inverted output node nQ of first flip-flop 146 is provided to input node D thereof. At this time, a signal on output node Q of first flip-flop 146 transitions from the low level to the high level. A signal on inverted output node nQ of first flip-flop 146 transitions to the low level.

At time t6, read enable signal /RE transitions from the low level to the high level, and a low-level signal on the inverted output node nQ of first flip-flop 146 is provided to input node D of first flip-flop 146. At this time, a signal on output node Q of first flip-flop 146 transitions to the low level. A signal on the inverted output node nQ of first flip-flop 146 transitions from the low level to the high level. That is, first rising clock CLK_R1 is generated in synchronization with a first rising edge of read enable signal /RE.

Referring to clock controller 141, second rising mask signal MASK_R2 is activated in synchronization with a first rising edge of read enable signal /RE. That is, where second rising mask signal MASK_R2 is provided to first decoder 145 via first decoding unit DU1, first decoder 145 connects the inverted output node nQ of first flip-flop 146 with input node D thereof in synchronization with the first rising edge of read enable signal /RE.

At time t6, at a second rising edge of read enable signal /RE, a high-level signal of the inverted output node nQ of first flip-flop 146 is provided to input node D thereof. At this time, a signal on output node Q of first flip-flop 146 transitions to the high level. A signal on the inverted output node nQ of first flip-flop 146 transitions to the low level.

At time t8, at a third rising edge of read enable signal /RE, a low-level signal of the inverted output node nQ of first flip-flop 146 is provided to input node D thereof. At this time, a signal on output node Q of first flip-flop 146 transitions to the low level, and a signal on the inverted output node nQ of first flip-flop 146 transitions to the high level. That is, second rising clock CLK_R2 is generated in synchronization with the third rising edge of read enable signal /RE.

Referring to clock controller 141, the k-th rising mask signal MASK_Rk is provided to first decoder 145 via first decoding unit DU1, a k-th rising clock CLK_Rk is generated. The k-th rising clock CLK_Rk is generated in synchronization with a k-th rising edge of read enable signal /RE.

Figure 9:
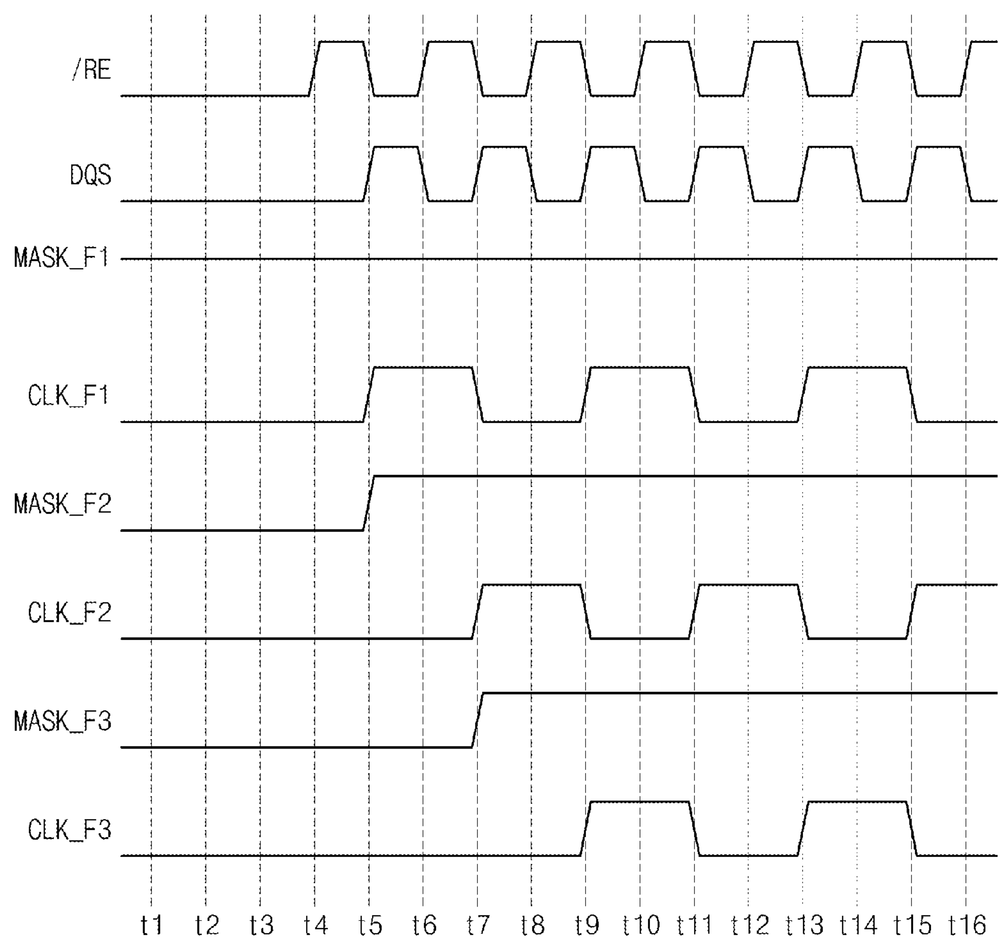
FIG. 9 is a third timing diagram for describing operations of the nonvolatile memory device of FIG. 1 according to an embodiment of the inventive concept.

FIG. 9 is a third timing diagram for describing operations of nonvolatile memory device 100 according to an embodiment of the inventive concept.

Referring to FIGS. 1 and 3 through 9, read enable signal /RE is toggled starting at time t4. A first falling mask signal MASK_F1 at the high level is output from clock controller 141. That is, where first falling mask signal MASK_F1 is provided to second decoder 147 via a second decoding unit DU2, an input node D of second flip-flop 148 is electrically connected with an inverted output node nQ thereof.

Where read enable signal /RE transitions from the high level to the low level at time t5, a high-level signal on the inverted output node nQ of second flip-flop 148 is provided to input node D thereof. At this time, a signal on output node Q of second flip-flop 148 transitions from the low level to the high level. A signal on the inverted output node nQ of second flip-flop 148 transitions to the low level.

At time t7, where read enable signal /RE transitions from the high level to the low level, a low-level signal on the inverted output node nQ of second flip-flop 148 is provided to input node D of second flip-flop 148. At this time, a signal on output node Q of second flip-flop 148 transitions to the low level. A signal on the inverted output node nQ of second flip-flop 148 transitions from the low level to the high level. That is, first falling clock CLK_F1 is generated in synchronization with a first falling edge of read enable signal /RE.

Referring to clock controller 141, second falling mask signal MASK_F2 is activated in synchronization with a first rising edge of read enable signal /RE. That is, where second rising mask signal MASK_F2 is provided to second decoder 147 via second decoding unit DU2, second decoder 147 connects the inverted output node nQ of second flip-flop 148 with input node D thereof in synchronization with the first rising edge of read enable signal /RE.

At time t7, at a second falling edge of read enable signal /RE, a high-level signal of the inverted output node nQ of second flip-flop 148 is provided to input node D thereof. At this time, a signal on output node Q of second flip-flop 148 transitions to the high level. A signal on the inverted output node nQ of second flip-flop 148 transitions to the low level.

At time t9, at a third falling edge of read enable signal /RE, a low-level signal of the inverted output node nQ of second flip-flop 148 is provided to input node D thereof. At this time, a signal on output node Q of second flip-flop 148 transitions to the low level, and a signal on the inverted output node nQ of second flip-flop 148 transitions to the high level. That is, second falling clock CLK_F2 is generated in synchronization with the third falling edge of read enable signal /RE.

Referring to clock controller 141, the k-th falling mask signal MASK_Fk is provided to second decoder 147 via second decoding unit DU2, and a k-th falling clock CLK_Fk is generated. The k-th falling clock CLK_Fk is generated in synchronization with a k-th falling edge of read enable signal /RE. Accordingly, clock generating circuit 140 responds to latency option LO to generate k-th rising clock CLK_Rk synchronized with the k-th rising edge of read enable signal /RE and k-th falling clock CLK_Fk synchronized with the k-th falling edge of read enable signal /RE. Clock generator 140 outputs as first clock CLK1 any one of the k-th rising and falling clocks CLK_Rk and CLK_Fk according to latency option LO. Clock generator 140 generates an inverted version of first clock CLK1 as second clock CLK2.

Figure 10:
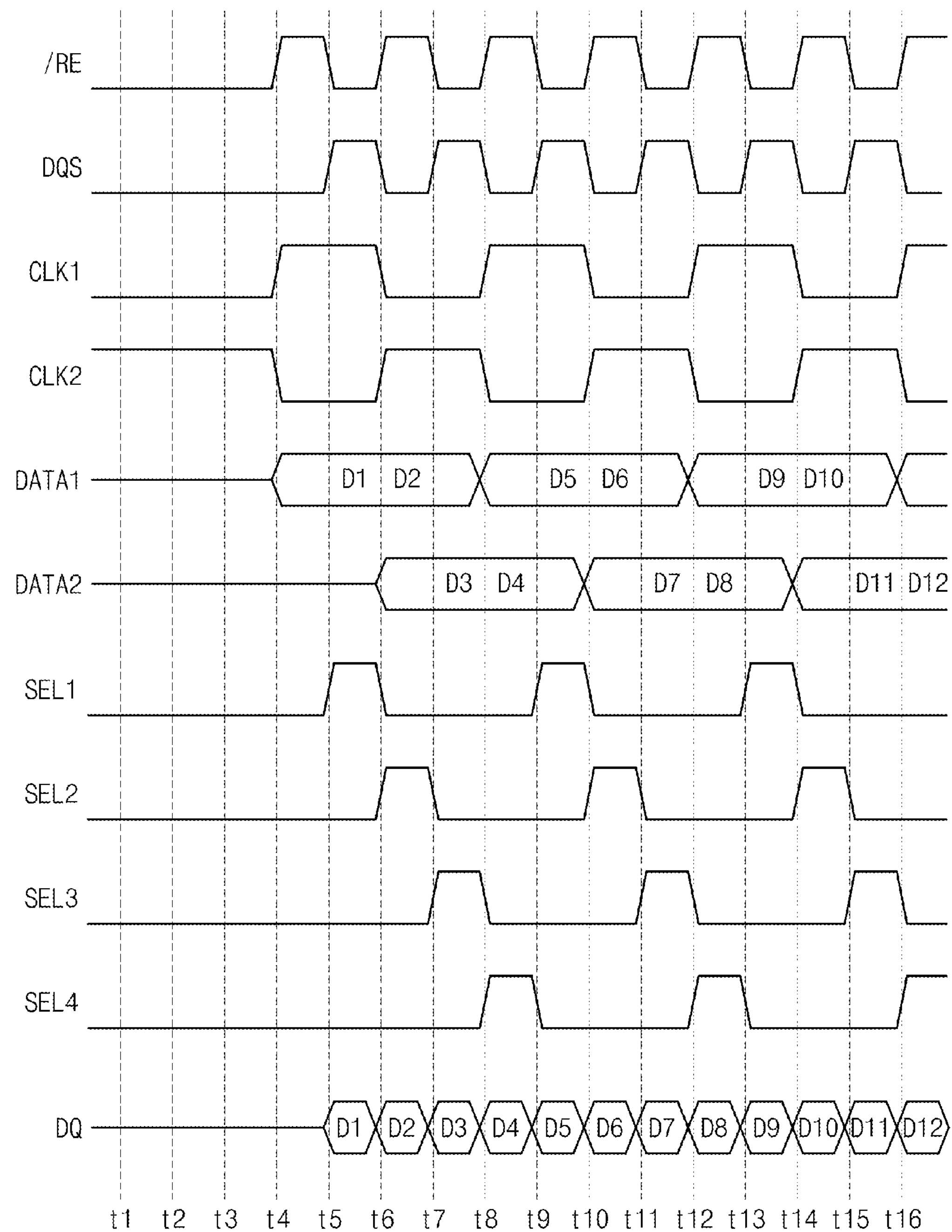
FIG. 10 is a timing diagram for describing a read operation of the nonvolatile memory device of FIG. 1 with a first latency option according to an embodiment of the inventive concept.

FIG. 10 is a timing diagram for describing a read operation of nonvolatile memory device 100 in which latency option LO is set to delay a clock signal by zero cycles (LO=0) after activation of a reset signal according to an embodiment of the inventive concept.

Referring to FIGS. 1 and 3 to 10, read enable signal /RE starts to be toggled from time t4. Input/output driver 170 generates strobe signal DQS in response to read enable signal /RE. Strobe signal DQS has the same waveform as read enable signal /RE and is delayed by a predetermined time on the basis of read enable signal /RE. As illustrated in FIG. 10, strobe signal DQS starts to be toggled at time t5 after read enable signal /RE is toggled.

It is assumed that a first rising clock CLK_R1 is selected according to latency option LO. Clock generator 140 generates first clock CLK1 and second clock CLK2 in response to latency option LO and the toggled read enable signal /RE. First and second clocks CLK1 and CLK2 are generated in synchronization with a first rising edge of read enable signal /RE.

Second clock CLK2 is an inverted version of first clock CLK1. First clock CLK1 is supplied to first and second read and write circuits 131 and 132, and second clock CLK2 is supplied to third and fourth read and write circuits 133 and 134.

First and second read and write circuits 131 and 132 read data corresponding to a received address ADDR from first and second sub-arrays 111 and 112. First and second read and write circuits 131 and 132 transfer the read data to de-multiplexer 160 in synchronization with first clock CLK1. For example, where first clock CLK1 is at the high level, first and second read and write circuits 131 and 132 send the read data to de-multiplexer 160.

Third and fourth read and write circuits 133 and 134 read data corresponding to the received address ADDR from third and fourth sub-arrays 113 and 114, and they transfer the read data to de-multiplexer 160 in synchronization with second clock CLK2. For example, where second clock CLK2 is at the high level, third and fourth read and write circuits 133 and 134 send the read data to de-multiplexer 160.

Combination logic 150 activates selection signals SEL1 through SEL4 in response to read enable signal /RE and first clock CLK1. Where first clock CLK1 is generated, selection signals SEL1 through SEL4 are generated sequentially and iteratively in synchronization with rising and falling edges of read enable signal /RE. For example, combination logic 150 can generate first selection signal SEL1 by multiplying strobe ready signal IN_DQS, which has the same phase as strobe signal DQS, obtained by delaying read enable signal /RE, with first clock CLK1. Second through fourth selection signals SEL2 through SEL4 are generated by delaying first selection signal SEL1 by half a clock period.

De-multiplexer 160 electrically connects first through fourth read and write circuits 131 through 134 to input/output driver 170 in response to first through fourth selection signals SEL1 through SEL4. That is, read data corresponding to an activated one of first through fourth selection signals SEL1 through SEL4 is output as an input/output signal DQ via input/output driver 170.

First, fifth and ninth data D1, D5, and D9 transferred via a first data path DATA1 can be data transferred from first read and write circuit 131. Second, sixth, and tenth data D2, D6, and D10 can be data transferred from second read and write circuit 132. Third, seventh, and eleventh data D3, D7, and D11 transferred via a second data path DATA2 can be data transferred from third read and write circuit 133. Fourth, eighth, and twelfth data D4, D8, and D12 can be data transferred from the fourth read and write circuit 134. First through twelfth data D1 through D 12 are provided as input/output signal DQ sequentially according to first through fourth selection signals SEL1 through SEL4. Although certain embodiments of nonvolatile memory device 100 have a dual data rate (DDR) interface that outputs data at rising and falling edges of strobe signal DQS, the inventive concept is not limited to this type of interface.

As illustrated in FIG. 10, first through fourth read and write circuits 131 through 134 transfer read data when strobe signal DQS starts to be toggled. The transferred data is provided as input/output signal DQ via input/output driver 170.

Figure 11:
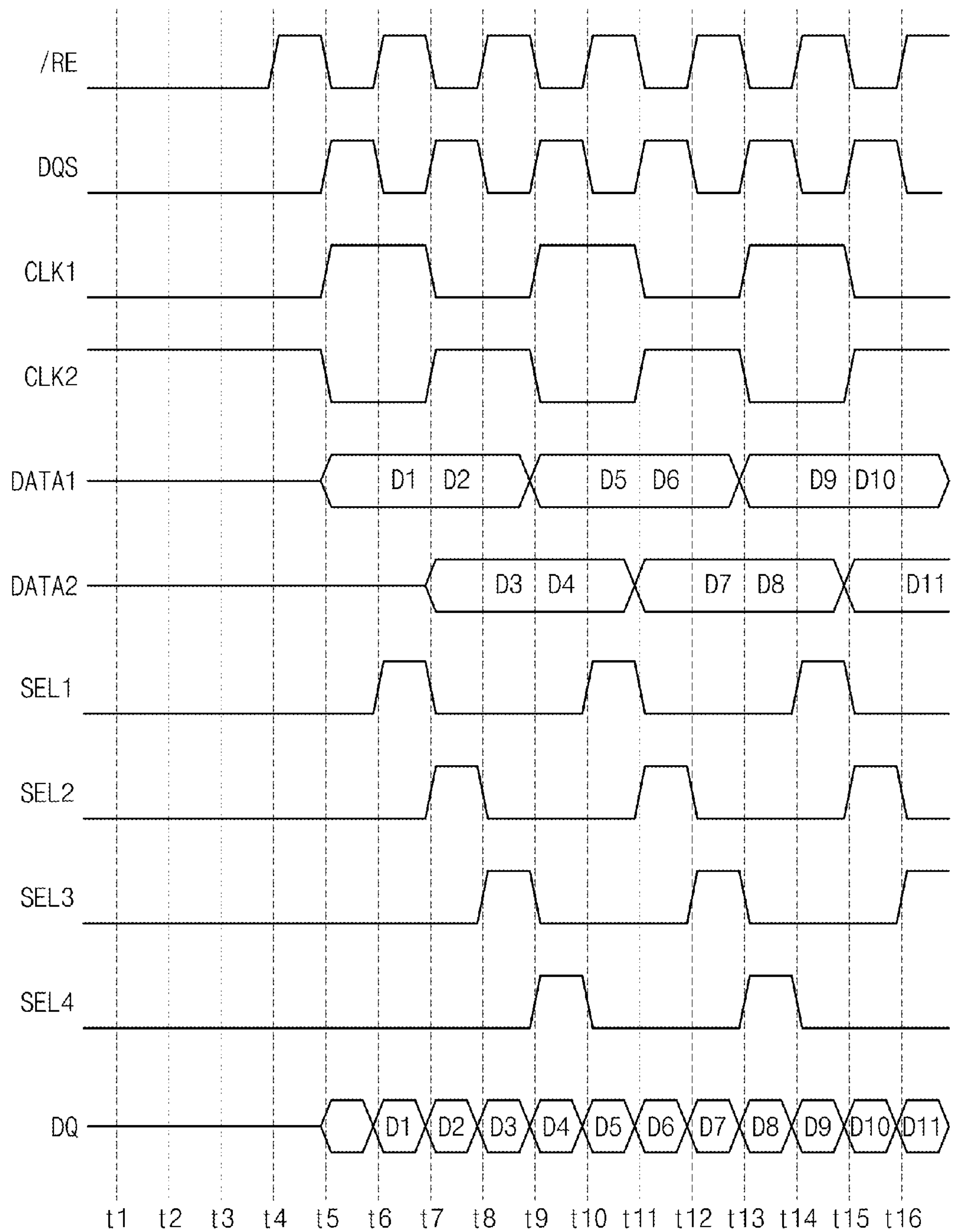
FIG. 11 is a timing diagram for describing a read operation of the nonvolatile memory device of FIG. 1 with a second latency option according to an embodiment of the inventive concept.

FIG. 11 is a timing diagram for describing a read operation of nonvolatile memory device 100 in which latency option LO is set to delay a clock signal by one half of a cycle (LO=0.5) after activation of a reset signal according to an embodiment of the inventive concept.

Referring to FIGS. 1, 3 through 9, and 11, read enable signal /RE starts to be toggled from time t4, and strobe signal DQS starts to be toggled at time t5.

It is assumed that a first falling clock CLK_R1 is selected according to latency option LO. Clock generator 140 generates first clock CLK1 and second clock CLK2 in response to latency option LO and the toggled read enable signal /RE. First and second clocks CLK1 and CLK2 are generated in synchronization with a first falling edge of read enable signal /RE.

First and second read and write circuits 131 and 132 read data corresponding to a received address ADDR, and they transfer the read data to de-multiplexer 160 in synchronization with first clock CLK1. Third and fourth read and write circuits 133 and 134 read data corresponding to the received address ADDR and transfer the read data to de-multiplexer 160 in synchronization with second clock CLK2.

First, fifth and ninth data D1, D5, and D9 transferred via first data path DATA1 can be data transferred from first read and write circuit 131. Second, sixth, and tenth data D2, D6, and D10 can be data transferred from second read and write circuit 132. Third, seventh, and eleventh data D3, D7, and D11 transferred via second data path DATA2 can be data transferred from third read and write circuit 133. Fourth and eighth data D4 and D8 can be data transferred from fourth read and write circuit 134. First through eleventh data D1 through D11 are provided as input/output signal DQ sequentially according to first through fourth selection signals SEL1 through SEL4.

Herein, first through fourth selection signals SEL1 through SEL4 are generated based on a signal obtained by multiplying read enable signal /RE with first clock CLK1 according to latency option LO. For example, first selection signal SEL1 can be generated by multiplying read enable signal /RE with first clock CLK1, and second through fourth selection signals SEL2 through SEL4 can be generated by delaying first selection signal SEL1 by half a clock period.

As illustrated in FIG. 11, first through fourth read and write circuits 131 through 134 transfer read data after strobe signal DQS is toggled once. First through fourth read and write circuits 131 through 134 transfer read data after half a period of strobe signal DQS has passed. More specifically, first through fourth read and write circuits 131 through 134 transfer read data in synchronization with a first falling edge of strobe signal DQS. The transferred data is output as input/output signal DQ via input/output driver 170.

Figure 12:
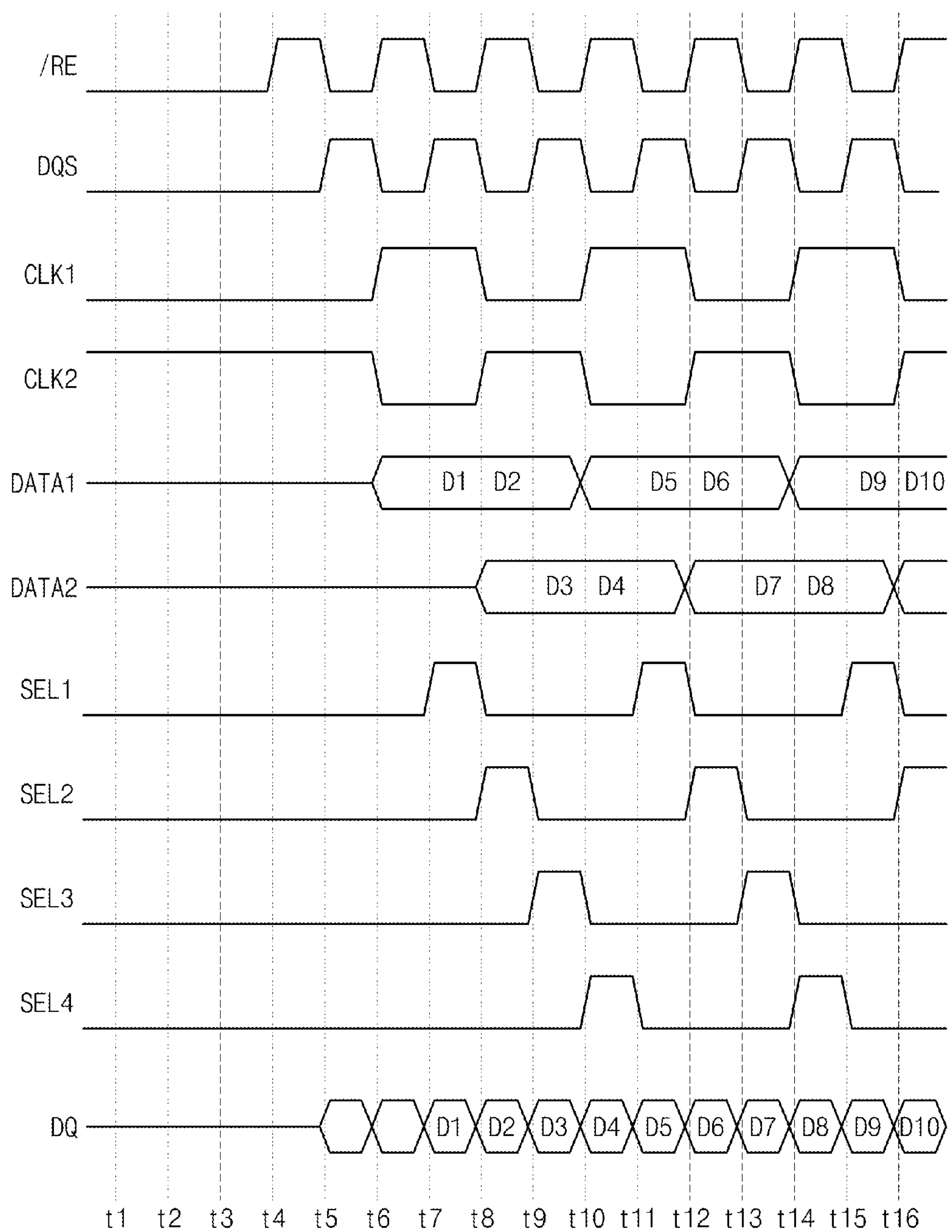
FIG. 12 is a timing diagram for describing a read operation of the nonvolatile memory device of FIG. 1 with a third latency option according to an embodiment of the inventive concept.

FIG. 12 is a timing diagram for describing a read operation of nonvolatile memory device 100 in which latency option LO is set to delay a clock signal by one cycle (LO=1) after activation of a reset signal according to an embodiment of the inventive concept.

Referring to FIGS. 1, 3 through 9, and 12, read enable signal /RE starts to be toggled from time t4, and strobe signal DQS starts to be toggled at time t5.

It is assumed that a second rising clock CLK_R2 is selected according to latency option LO. Clock generator 140 generates first clock CLK1 and second clock CLK2 in response to latency option LO and the toggled read enable signal /RE. First and second clocks CLK1 and CLK2 are generated in synchronization with a second rising edge of read enable signal /RE.

First and second read and write circuits 131 and 132 read data corresponding to a received address ADDR, and they transfer the read data to de-multiplexer 160 in synchronization with first clock CLK1. Third and fourth read and write circuits 133 and 134 read data corresponding to the received address ADDR and transfer the read data to de-multiplexer 160 in synchronization with second clock CLK2.

First, fifth and ninth data D1, D5, and D9 transferred via first data path DATA1 can be data transferred from first read and write circuit 131. Second, sixth, and tenth data D2, D6, and D10 can be data transferred from the second read and write circuit 132. Third and seventh data D3 and D7 transferred via second data path DATA2 can be data transferred from third read and write circuit 133. Fourth and eighth data D4 and D8 can be data transferred from fourth read and write circuit 134. First through tenth data D1 through D10 are provided as input/output signal DQ sequentially according to first through fourth selection signals SEL1 through SEL4.

First through fourth selection signals SEL1 through SEL4 are generated based on a signal obtained by multiplying first clock CLK1 with a strobe ready signal IN_DQS according to latency option LO. Strobe ready signal IN_DQS has the same phase as strobe signal DQS and is obtained by delaying read enable signal /RE by half a cycle. For example, first selection signal SEL1 is generated by multiplying strobe ready signal IN_DQS with first clock CLK1. Second through fourth selection signals SEL2 through SEL4 are generated by delaying first selection signal SEL1 by half a clock period.

As illustrated in FIG. 12, first through fourth read and write circuits 131 through 134 transfer read data after strobe ready signal IN_DQS is toggled twice. First through fourth read and write circuits 131 through 134 transfer read data after one period of strobe signal DQS is generated. In particular, first through fourth read and write circuits 131 through 134 transfer read data in synchronization with a second rising edge of strobe signal DQS. The transferred data is output as input/output signal DQ via input/output driver 170.

Figure 13:
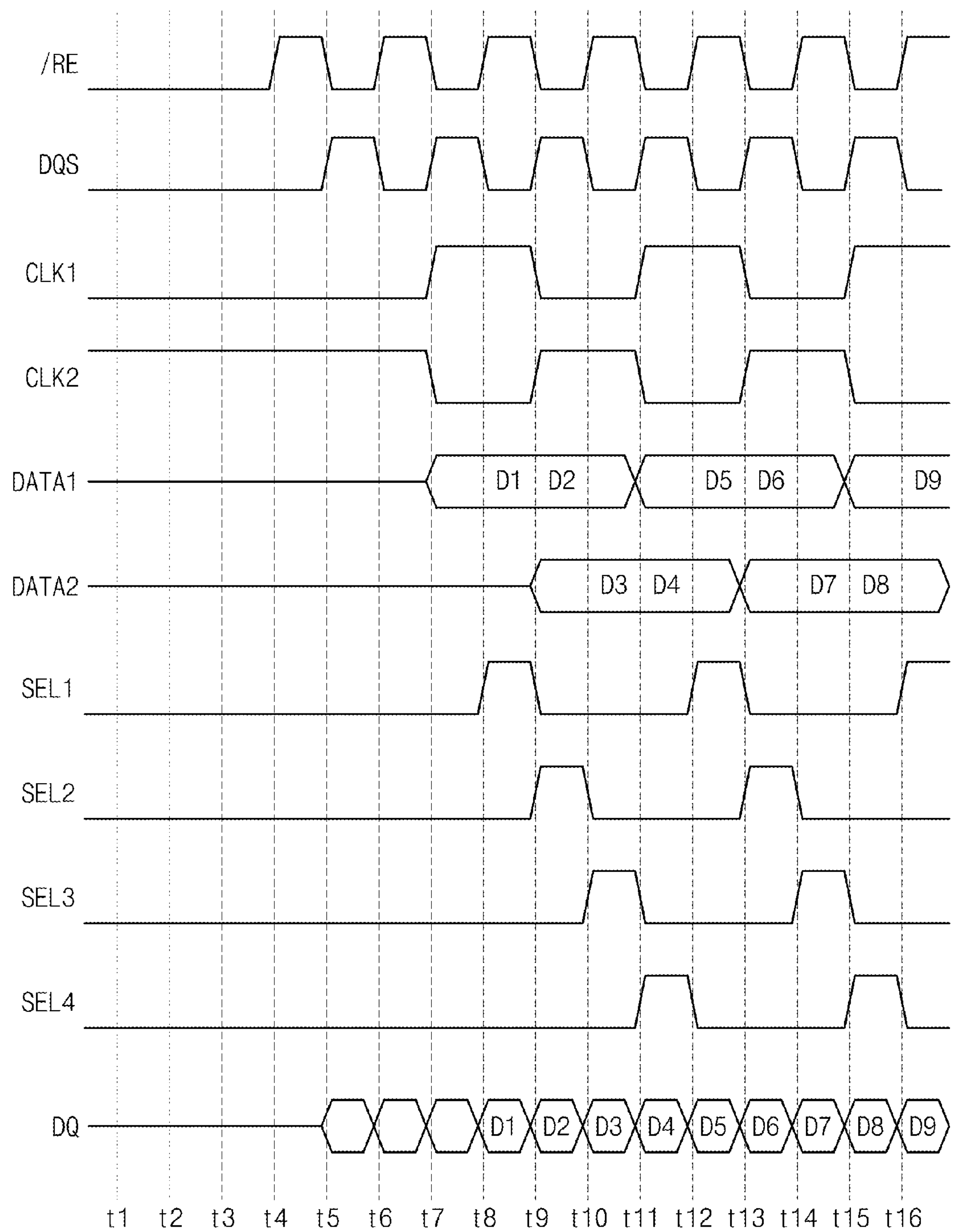
FIG. 13 is a timing diagram for describing a read operation of the nonvolatile memory device of FIG. 1 with a fourth latency option according to an embodiment of the inventive concept.

FIG. 13 is a timing diagram for describing a read operation of nonvolatile memory device 100 in which latency option LO is set to delay a clock signal by one and a half cycles (LO=1.5) after activation of a reset signal according to an embodiment of the inventive concept.

Referring to FIGS. 1, 3 through 9, and 13, a read enable signal /RE starts to be toggled from time t4, and strobe signal DQS starts to be toggled at time t5.

It is assumed that a second falling clock CLK_F2 is selected according to latency option LO. Clock generator 140 generates first clock CLK1 and second clock CLK2 in response to latency option LO and the toggled read enable signal /RE. First and second clocks CLK1 and CLK2 are generated in synchronization with a second rising edge of read enable signal /RE.

First and second read and write circuits 131 and 132 read data corresponding to a received address ADDR, and they transfer the read data to de-multiplexer 160 in synchronization with first clock CLK1. Third and fourth read and write circuits 133 and 134 read data corresponding to the received address ADDR and transfer the read data to de-multiplexer 160 in synchronization with second clock CLK2.

First, fifth and ninth data D1, D5, and D9 transferred via first data path DATA1 can be data transferred from first read and write circuit 131. Second and sixth data D2 and D6 can be data transferred from second read and write circuit 132. Third and seventh data D3 and D7 transferred via second data path DATA2 can be data transferred from third read and write circuit 133. Fourth and eighth data D4 and D8 can be data transferred from fourth read and write circuit 134. First through ninth data D1 through D9 are provided as input/output signal DQ sequentially according to first through fourth selection signals SEL1 through SEL4.

First through fourth selection signals SEL1 through SEL4 are generated based on a signal obtained by multiplying first clock CLK1 with read enable signal /RE according to latency option LO. For example, first selection signal SEL1 can be generated by multiplying read enable signal /RE with first clock CLK1. Second through fourth selection signals SEL2 through SEL4 can be generated by delaying first selection signal SEL1 by half a clock period.

As illustrated in FIG. 13, first through fourth read and write circuits 131 through 134 transfer read data after strobe signal DQS is toggled three times. First through fourth read and write circuits 131 through 134 transfer read data after a 1.5 periods of strobe signal DQS have passed. In particular, first through fourth read and write circuits 131 through 134 transfer read data in synchronization with a second falling edge of strobe signal DQS. The transferred data is output as input/output signal DQ via input/output driver 170.

As described above, one of rising clocks CLK_R1 through CLK_Rn and falling clocks CLK_F1 through CLK_Fn is selected according to latency option LO. First clock CLK1 and a second clock CLK2 are generated from the selected clock. First and second clocks CLK1 and CLK2 are delayed on the basis of strobe signal DQS according to latency option LO. Read data is output in synchronization with first and second clocks CLK1 and CLK2. Accordingly, nonvolatile memory device 100 outputs input/output signal DQ after strobe signal DQS is toggled a predetermined number of times.

Strobe signal DQS starts to be toggled from a fixed level. At transitions, strobe signal DQS may be distorted. As the frequency of strobe signal DQS increases, there is an increased probability that strobe signal DQS distortion will occur. Accordingly, in certain embodiments of the inventive concept, input/output signal DQ is output after strobe signal DQS is toggled a predetermined number of times. That is, input/output signal DQ is output after strobe signal DQS is stabilized. This can improve the reliability of nonvolatile memory device 100.

Figure 14:
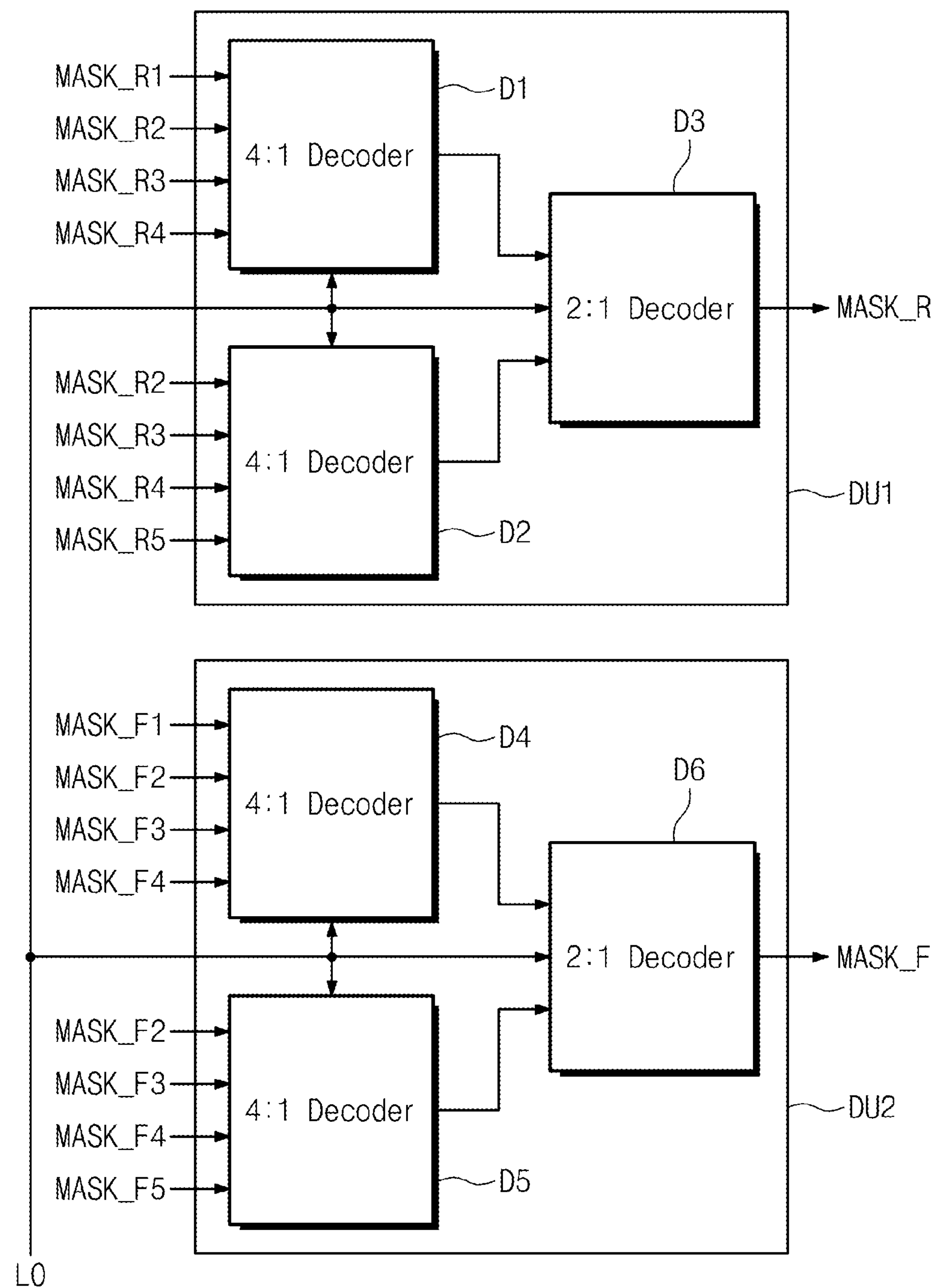
FIG. 14 is a block diagram of a first decoding unit and a second decoding unit of FIG. 6 according to an embodiment of the inventive concept.

FIG. 14 is a block diagram of first and second decoding units DU1 and DU2 of FIG. 6 according to an embodiment of the inventive concept. In the example of FIG. 14, first decoding unit DU1 receives first through fifth rising mask signals MASK_R1 through MASK_R5, and second decoding unit DU2 receives first to fifth falling mask signals MASK_F1 through MASK_F5. However, in alternative embodiments, the number of mask signals applied to first and second decoding units DU1 and DU2 can vary.

Referring to FIG. 14, first decoding unit DU1 comprises first through third decoders D1 through D3. First decoder D1 receives first through fourth mask signals MASK_R1 through MASK_R4, and second decoder D2 receives second through fifth mask signals MASK_R2 through MASK_R5. First decoder D1 selects one of first through fourth mask signals MASK_R1 through MASK_R4 in response to latency option LO. Second decoder D2 selects one of second through fifth mask signals in response to latency option LO. First and second decoders D1 and D2 are configured to obtain an offset value for selecting one of four inputs from latency option LO. First and second decoders D1 and D2 each transfer one of the inputs as an output signal according to an obtained offset value.

Where an offset value of latency option LO indicates “0 clock cycles” (LO=0), first decoder D1 outputs the first rising mask signal MASK_R1, and second decoder D2 outputs second rising mask signal MASK_R2. Where an offset value of latency option LO indicates “0.5 clock cycles” (L=0.5), first decoder D1 outputs second rising mask signal MASK_R2, and second decoder D2 outputs third rising mask signal MASK_R3. Where an offset value of latency option LO indicates “0.5 k clock cycles”, first decoder D1 selects a k-th input as its output, and second decoder D2 selects a k-th input as its output.

Third decoder D3 receives output signals of first and second decoders D1 and D2. Third decoder D3 responds to latency option LO to output one of output signals of first and second decoders D1 and D2 as a rising mask signal MASK_R.

Second decoding unit DU2 comprises fourth through sixth decoders D4 through D6. Second decoding unit DU2 outputs a falling mask signal MASK_F in response to first through fifth falling mask signals MASK_F1 through MASK_F5 and latency option LO.

Second decoding unit DU2 is configured the same as first decoding unit DU1 except that it receives first through fifth falling mask signals MASK_F1 through MASK_F5 instead of first through fifth rising mask signals MASK_R1 through MASK_R5. Accordingly, a further description of second decoding unit DU2 is omitted. Where first and second decoding units DU1 and DU2 are configured as illustrated in FIG.

14, the timing of generating first clock CLK1 can be adjusted according to latency option LO.

As described with reference to FIG. 14, first and second decoding units DU1 and DU2 can be implemented using decoders with relatively low complexity. Accordingly, it is possible to provide rising and falling mask signals MASK_R and MASK_F by adjusting an offset supplied to decoders of relatively low complexity.

Figure 15:
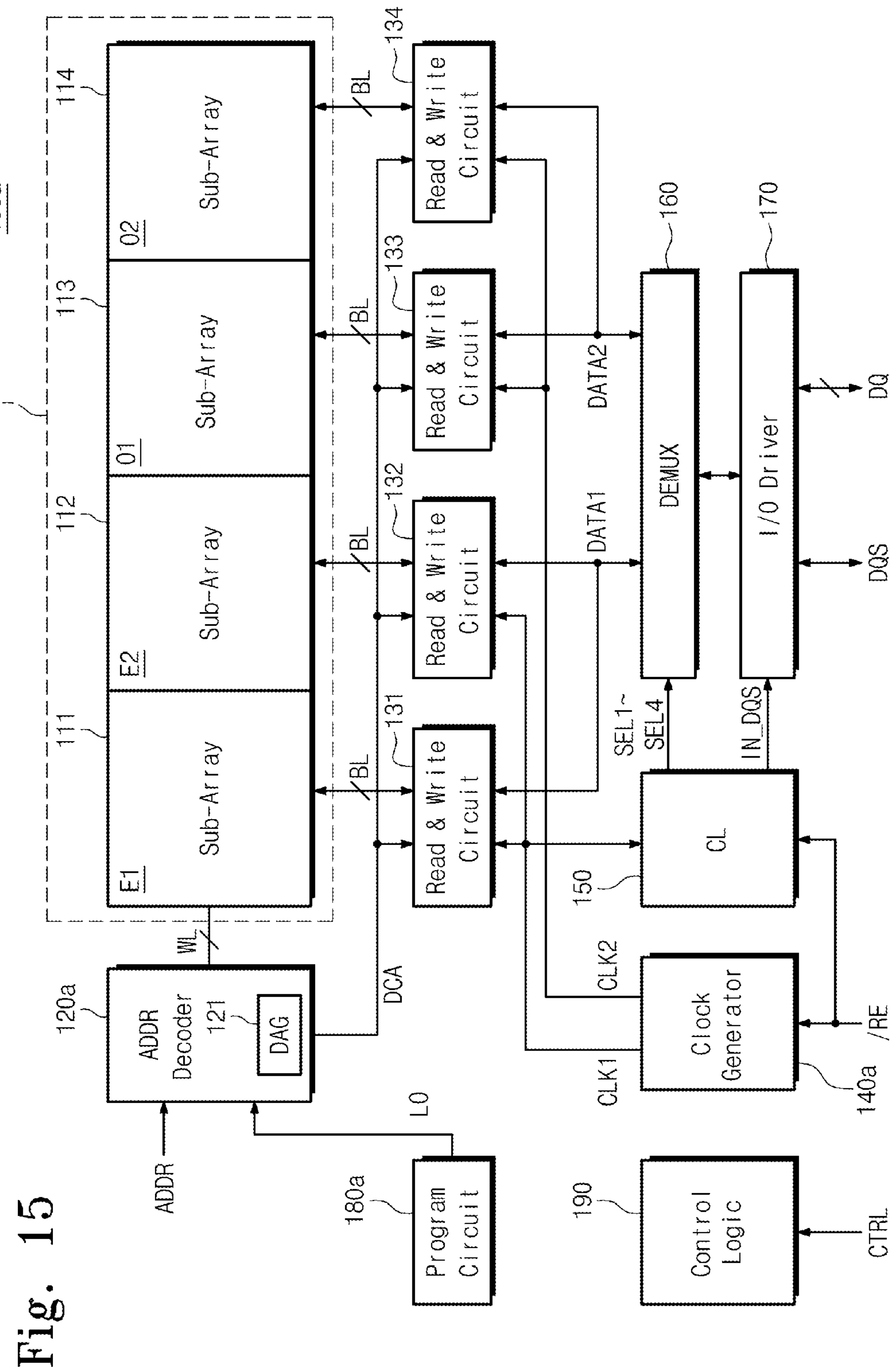
FIG. 15 is a block diagram of a nonvolatile memory device according to a second embodiment of the inventive concept.

FIG. 15 is a block diagram of a nonvolatile memory device 100*a* according to a second embodiment of the inventive concept.

Referring to FIG. 15, a nonvolatile memory device 100*a* comprises memory cell array 110, an address decoder 120*a*, first through fourth read and write circuits 131 through 134, a clock generator 140*a*, combination logic 150, de-multiplexer 160, input/output driver 170, a program circuit 180*a*, and control logic 190. Nonvolatile memory device 100*a* has the same structure as that illustrated in FIG. 1 except for the features 120*a*, 140*a*, and 180*a*.

Address decoder 120*a* receives latency option LO from program circuit 180*a*. Address decoder 120*a* comprises dummy address generator 121. Dummy address generator 121 generates a dummy address based on latency option LO. Address decoder 120*a* decodes the dummy address and a received address ADDR. The dummy address is an address in first through fourth sub-arrays 111 through 114.

Clock generator 140*a* generates first and second clocks CLK1 and CLK2. For example, where read enable signal /RE starts to be toggled, clock generator 140*a* generates first and second clocks CLK1 and CLK2 synchronized at a first rising edge of read enable signal /RE.

Program circuit 180*a* stores latency option LO. Latency option LO comprises information indicating the number of dummy addresses generated by dummy address generator 121.

Nonvolatile memory device 100*a* operates in a manner described with reference to FIG. 2. That is, first through fourth read and write circuits 131 through 134 of nonvolatile memory device 100*a* are configured to output read data via de-multiplexer 160 and input/output driver 170 after strobe signal DQS is toggled a predetermined number of times.

Figure 16:
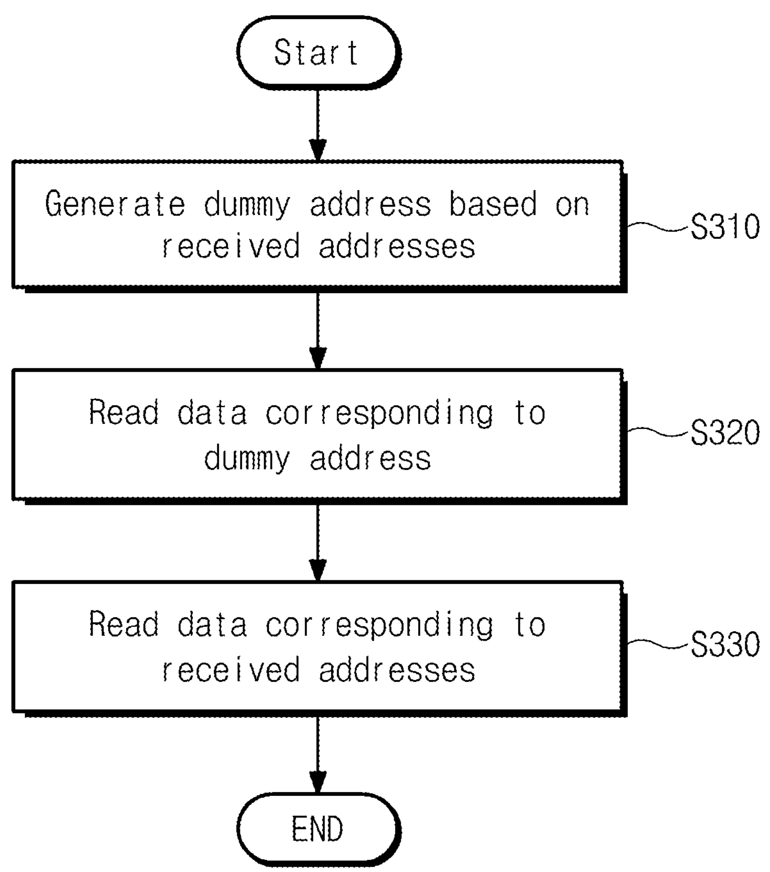
FIG. 16 is a flowchart illustrating a method of performing a read operation in the nonvolatile memory device of FIG. 15 according to an embodiment of the inventive concept.

FIG. 16 is a flowchart illustrating a method of performing a read operation in the nonvolatile memory device 100*a* of FIG. 15 according to an embodiment of the inventive concept. The method of FIG. 16 corresponds to step S150 described in FIG. 2.

Referring to FIGS. 2, 15, and 16, nonvolatile memory device 100*a* generates at least one dummy address based on a received address ADDR (S310). For example, dummy address generator 121 can generate a dummy address using a previously stored address. Dummy address generator 121 can be configured to generate the dummy address using at least one address of received address ADDR.

Next, nonvolatile memory device 100*a* reads out data corresponding to the at least one dummy address (S320). Address decoder 120*a* decodes a dummy row address of the at least one dummy address to select word lines WL. Address decoder 120*a* also decodes a dummy column address of the at least one dummy address. First through fourth read and write circuits 131 through 134 read data corresponding to the at least one dummy address based on the decoded dummy column address.

Thereafter, nonvolatile memory device 100*a* reads out data corresponding to the received address ADDR (S330). Address decoder 120*a* decodes a row address of the received address ADDR to select word lines WL, and it decodes a column address of the received address ADDR. First through fourth read and write circuits 131 through 134 read data corresponding to the received address ADDR based on the decoded column address.

Figure 17:
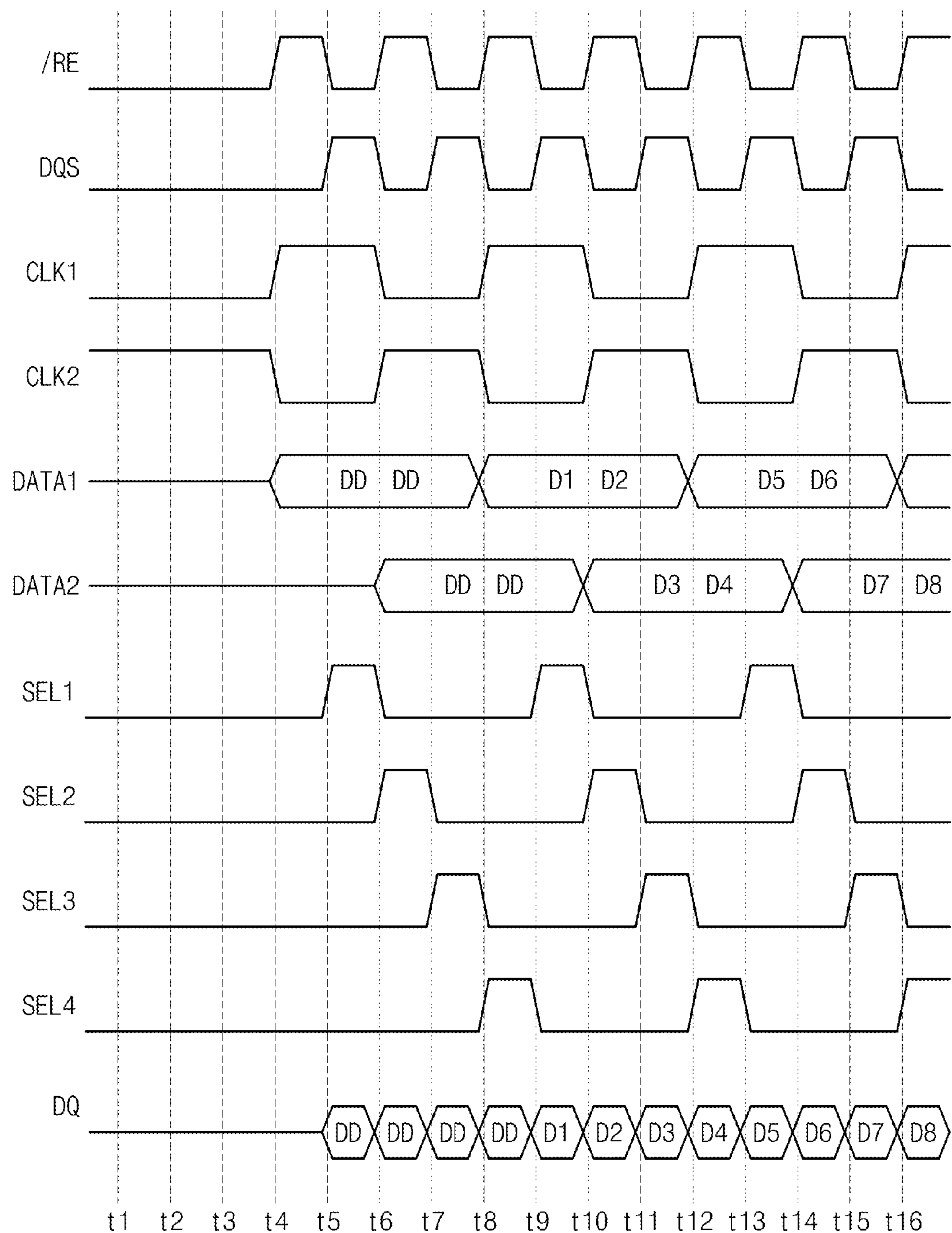
FIG. 17 is a timing diagram for describing a read operation of the nonvolatile memory device of FIG. 15 with a latency option according to an embodiment of the inventive concept.

FIG. 17 is a timing diagram for describing a read operation of nonvolatile memory device 100*a* of FIG. 15 with a latency option according to an embodiment of the inventive concept.

Referring to FIGS. 15 and 17, at time t4, read enable signal /RE starts to be toggled. Input/output driver 170 generates strobe signal DQS according to a transition of read enable signal /RE. Clock generator 140*a* generates first clock CLK1 and second clock CLK2.

Dummy address generator 121 generates at least one dummy address according to latency option LO. It is assumed that dummy address generator 121 generates four dummy addresses.

First through fourth read and write circuits 131 through 134 read data corresponding to the generated dummy addresses. Read data DD is output as input/output signal DQ via de-multiplexer 160 and input/output driver 170.

After data corresponding to the dummy addresses is read, first through fourth read and write circuits 131 through 134 read data corresponding to the received address ADDR. Read data D1 through D8 is output as input/output signal DQ via de-multiplexer 160 and input/output driver 170.

Data corresponding to the received address ADDR is output after data corresponding to at least one dummy address is output. That is, data corresponding to the received address ADDR is output after strobe signal DQS is toggled a predetermined number of times. The reliability of nonvolatile memory device 110*a* is improved because data signal DQ is output after data strobe signal DQS is stabilized.

Figure 18:
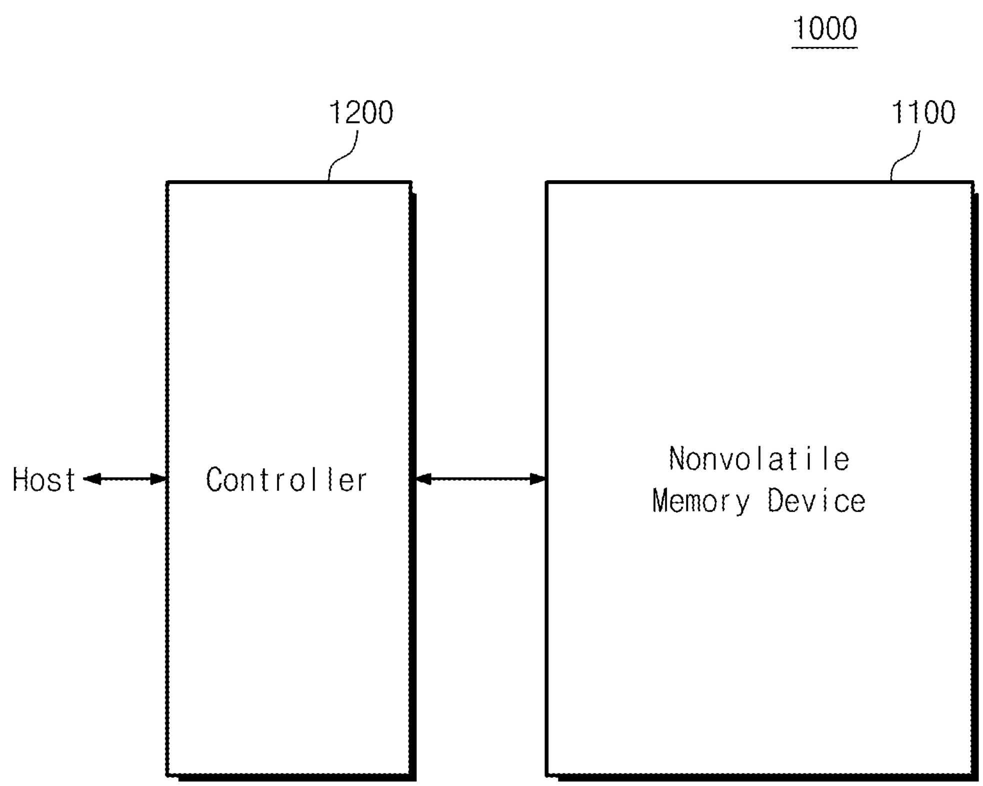
FIG. 18 is a block diagram of a memory system according to an embodiment of the inventive concept.

FIG. 18 is a block diagram of a memory system 1000 according to an embodiment of the inventive concept.

Referring to FIG. 18, memory system 1000 comprises a nonvolatile memory device 1100 and a controller 1200. Nonvolatile memory device 1100 can have the same structure and function as nonvolatile memory device 100 or 100*a*. Accordingly, nonvolatile memory device 1100 can output input/output signal DQ after strobe signal DQS is toggled a predetermined number of times.

Controller 1200 is connected with a host and nonvolatile memory device 1100. Controller 1200 accesses nonvolatile memory device 1100 in response to a request from the host. Controller 1200 controls read, write, erase, and background operations of nonvolatile memory device 1100, and it provides an interface between the host and nonvolatile memory device 1100. Controller 1200 can also drive firmware for controlling nonvolatile memory device 1100.

Controller 1200 provides a control signal CTRL and an address ADDR to nonvolatile memory device 1100. Controller 1200 provides a read enable signal /RE and a chip enable signal /CE to nonvolatile memory device 1100.

Controller 1200 exchanges an input/output signal DQ with nonvolatile memory device 1100. In a read operation, controller 1200 receives a data signal DQ from nonvolatile memory device 1100 after a strobe signal DQS from nonvolatile memory device 110 is toggled a predetermined number of times.

Controller 1200 can comprise, for instance, a RAM, a processing unit, a host interface, a memory interface, and other features. The RAM can be used as a working memory of the processing unit, a cache memory between nonvolatile memory device 1100 and the host, and a buffer memory between nonvolatile memory device 110 and the host. The processing unit controls an overall operation of controller 1200.

The host interface implements a protocol for data exchange between the host and controller 1200. Controller 1200 typically communicates with the host via at least one of a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol. The memory interface facilitates communication with nonvolatile memory device 1100, and it can comprise, for instance, a NAND interface or a NOR interface.

Memory system 1000 further comprises an EEC block that detects and corrects errors in data read out from nonvolatile memory device 1100 using ECC parity data. The ECC block is typically implemented as an element of controller 1200 or nonvolatile memory device 1100.

Controller 1200 and nonvolatile memory device 1100 can be integrated in one semiconductor device. For example, in some embodiments, controller 1200 and nonvolatile memory device 1100 are integrated in one semiconductor device to form a memory card such as a PC card, a CF card, SM, SMC, a memory stick, MMC, RS-MMC, MMCmicro, an SD card, a miniSD card, a microSD card, SDHC, or a UFS card.

Controller 1200 and nonvolatile memory device 1100 can also be integrated in one semiconductor device to form a solid state drive (SSD). Where memory system 1000 is used as an SSD, it can improve an operating speed of a host connected with memory system 1000.

Memory system 1000 can be used in various types of devices, such as a computer, portable computer, Ultra Mobile PC (UMPC), workstation, net-book, PDA, web tablet, wireless phone, mobile phone, smart phone, e-book, PMP (portable multimedia player), digital camera, digital audio recorder/player, digital picture/video recorder/player, portable game machine, navigation system, black box, 3-dimensional television, a device capable of transmitting and receiving information at a wireless circumstance, one of various electronic devices constituting home network, one of various electronic devices constituting computer network, one of various electronic devices constituting telematics network, RFID, or one of various electronic devices constituting computing system.

Nonvolatile memory device 1100 or memory system 1000 can be packaged using various types of packages or package configurations such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), metric quad flat pack (MQFP), small outline integrated circuit (SOIC), shrink small outline package (SSOP), thin small outline package (TSOP), thin quad flatpack (TQFP), system in package (SIP), multi chip package (MCP), Wafer-level Fabricated Package (WFP), and Wafer-Level Processed Stack Package (WSP).

Figure 19:
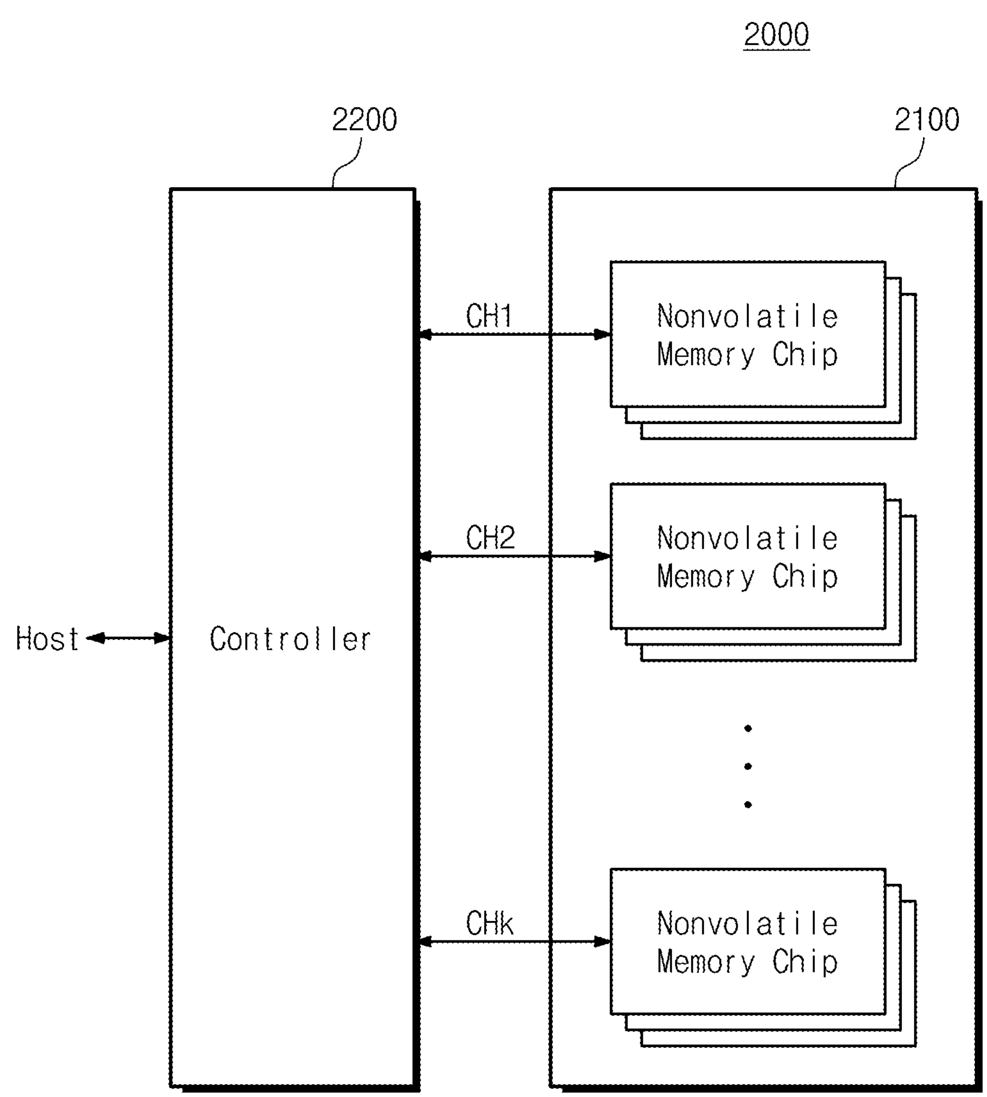
FIG. 19 is a block diagram of a memory system according to another embodiment of the inventive concept.

FIG. 19 is a block diagram of a memory system 2000 comprising multiple nonvolatile memory chips according to an embodiment of the inventive concept.

Referring to FIG. 19, memory system 2000 comprises a nonvolatile memory device 2100 and a controller 2200. Nonvolatile memory device 2100 comprises a plurality of nonvolatile memory chips divided into a plurality of groups. The nonvolatile memory chips in each group are configured to communicate with controller 2200 via a common channel. The plurality of nonvolatile memory chips communicates controller 2200 via a plurality of channels CH1 through CHk.

Each of the nonvolatile memory chips has the same structure and functionality as nonvolatile memory device 100 or 100*a*. Accordingly, each nonvolatile memory chip outputs an input/output signal DQ after a strobe signal DQS is toggled a predetermined number of times. Although FIG. 19 shows a plurality of nonvolatile memory chips connected with one channel, memory system 200 can be modified so that a nonvolatile memory chip is connected with one channel.

Figure 20:
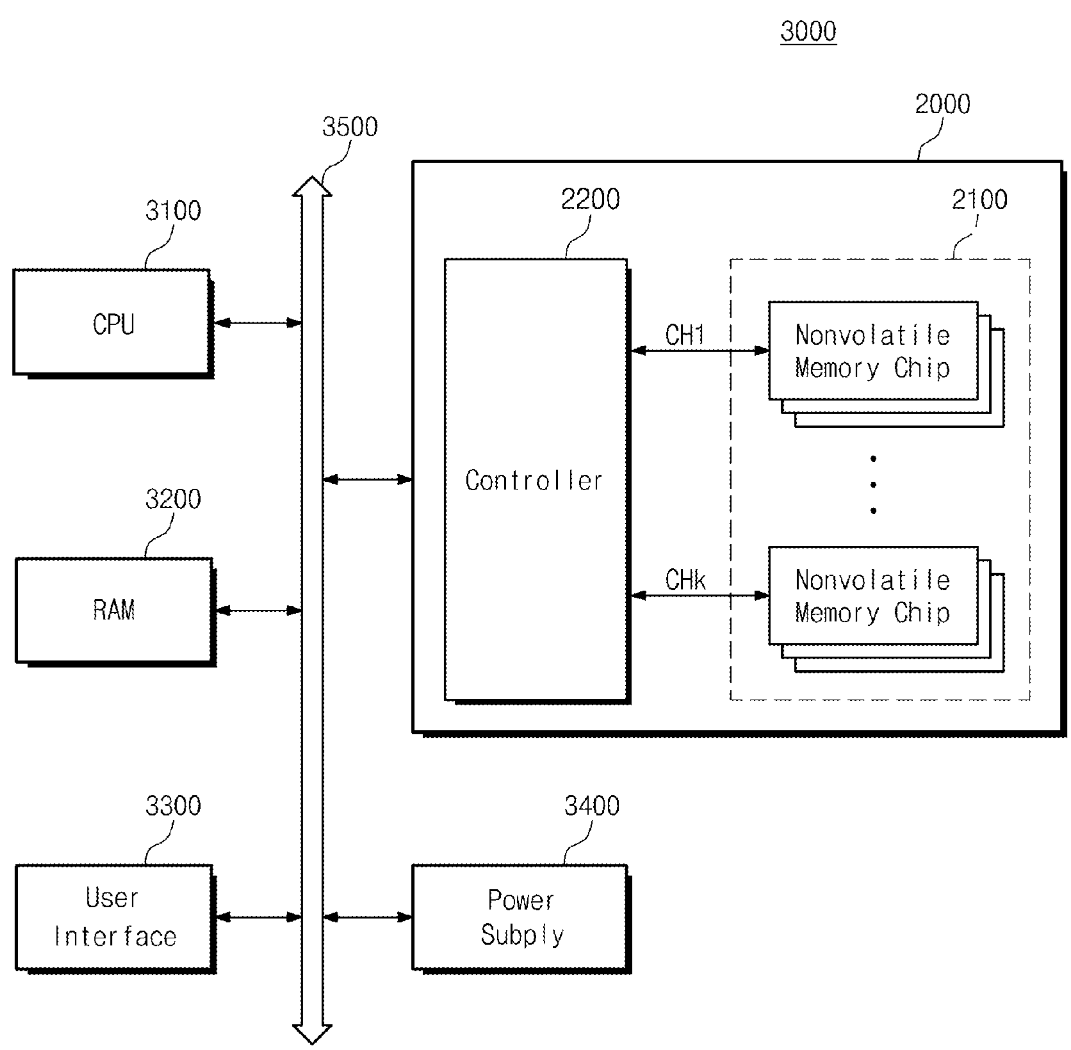
FIG. 20 is a block diagram of a computing system incorporating the memory system of FIG. 19 according to an embodiment of the inventive concept.

FIG. 20 is a block diagram of a computing system 3000 comprising memory system 2000 of FIG. 19.

Referring to FIG. 20, computing system 3000 comprises a central processing unit (CPU) 3100, RAM 3200, a user interface 3300, a power supply 3400, and a memory system 2000.

Memory system 2000 is connected to features 3100 through 3400 via a system bus 3500. Data provided via user interface 3300 or processed by CPU 3100 is stored in memory system 2000.

Although FIG. 20 shows nonvolatile memory device 2100 connected with system bus 3500 via controller 2200, nonvolatile memory device 2100 could alternatively be connected directly to system bus 3500. In addition, although the embodiment of FIG. 20 includes memory system 2000, it could alternatively include memory system 1000 or another memory system. Moreover, computing system 3000 could be modified to incorporate both of memory systems 1000 and 2000.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A method of reading a nonvolatile memory device, comprising:

receiving a read command;

receiving addresses;

detecting a transition of a read enable signal;

generating a strobe signal based on the transition of the read enable signal;

reading data corresponding to the received addresses; and outputting the read data together with the strobe signal to an external device, wherein a start of the output of the read data occurs after the strobe signal is toggled a predetermined number of times.

2. The method of claim 1, wherein outputting the read data comprises:

generating a clock that is delayed according to toggling of the read enable signal; and outputting the read data in synchronization with the delayed clock.

3. The method of claim 2, wherein the delayed clock is synchronized with a rising edge or a falling edge of the toggled read enable signal.

4. The method of claim 2, wherein the delayed clock is generated with a timing determined by a latency option.

5. The method of claim 1, wherein reading data corresponding to the received addresses comprises:

generating at least one dummy address based on the received addresses;

reading data corresponding to the at least one dummy address; and reading the data corresponding to the received addresses.

6. The method of claim 5, wherein outputting the read data comprises:

outputting the data corresponding to the received addresses after the data corresponding to the at least one dummy address is output.

7. The method of claim 5, wherein generating at least one dummy address comprises reading a previously stored address.

8. The method of claim 5, wherein generating the at least one dummy address is performed using at least one of the received addresses.

9. A nonvolatile memory device, comprising:

a memory cell array;

an address decoder that selects a word line of the memory cell array in response to received addresses;

a clock generator that generates a clock based on a read enable signal;

a read and write circuit that reads data corresponding to the received addresses from the memory cell array and transfers the read data in response to the clock; and an input/output driver that outputs a strobe signal together with the read data to an external device, the strobe signal being output in response to the read enable signal and the read data being transferred from the read and write circuit, wherein a start of the output of the read data occurs after the strobe signal is toggled a predetermined number of times.

10. The nonvolatile memory device of claim 9, wherein the clock generator is configured to generate the clock after the strobe signal is toggled a predetermined number of times.

11. The nonvolatile memory device of claim 9, wherein the memory cell array is divided into a plurality of sub-arrays and the read and write circuit is divided into a plurality of read and write circuits each corresponding to the plurality of sub-arrays, and wherein the nonvolatile memory device further comprises a combination logic that generates a selection signal in synchronization with the clock and the read enable signal, and a de-multiplexer that electrically connects at least one of the plurality of read and write circuits with the de-multiplexer in response to the selection signal.

12. The nonvolatile memory device of claim 9, wherein the address decoder comprises a dummy address generator that generates at least one dummy address, and the read and write circuit is configured to read data corresponding to the at least one dummy address from the memory cell array and to read data corresponding to the received addresses from the memory cell array.

13. A nonvolatile memory device, comprising:

a memory cell array;

an address decoder that selects a word line of the memory cell array in response to received addresses;

a clock generator that generates a clock based on a read enable signal;

a read and write circuit that reads data corresponding to the received addresses from the memory cell array and transfers the read data in response to the clock; and an input/output driver that outputs a strobe signal in response to the read enable signal and outputs the read data transferred from the read and write circuit, wherein the read data is output after the strobe signal is toggled a predetermined number of times, wherein the clock generator comprises:

a clock controller that generates a plurality of rising mask signals activated in synchronization with a rising edge of the read enable signal being toggled; and a clock generating circuit that generates the clock in synchronization with the plurality of rising mask signals.

14. The nonvolatile memory device of claim 13, wherein the clock controller comprises a plurality of flip-flops connected in series and operating in synchronization with a rising edge of the read enable signal being toggled, and wherein a first flip-flop among the plurality of flip-flops has an input node connected with a power supply voltage, and signals on the input node of the first flip-flop and output nodes of the plurality of flip-flops are used as the rising mask signals.

15. The nonvolatile memory device of claim 14, wherein the plurality of flip-flops are reset in response to activation of a chip enable signal.

16. The nonvolatile memory device of claim 13, wherein the clock generating circuit comprises:

a flip-flop; and a decoder that electrically connects an input node of the flip-flop with an output node or an inverted output node of the flip-flop in response to one of the rising mask signals, wherein a signal of the output node of the flip-flop is provided as the clock.

17. The nonvolatile memory device of claim 13, further comprising a program circuit that stores and outputs a latency option for selecting one of the plurality of rising mask signals.

18. The nonvolatile memory device of claim 13, wherein the clock controller is configured to further generate a plurality of falling mask signals activated in synchronization with a falling edge of the read enable signal being toggled, and the clock generating circuit is further configured to generate the clock in synchronization with the plurality of rising mask signals and the plurality of falling mask signals.

19. A memory system, comprising:

a nonvolatile memory device; and a controller configured to control the nonvolatile memory device, wherein the nonvolatile memory device comprises:

a memory cell array;

an address decoder that selects a word line of the memory cell array in response to received addresses;

a clock generator that generates a clock based on a read enable signal;

a read and write circuit that reads data corresponding to the received addresses from the memory cell array and transfers the read data in response to the clock; and an input/output driver that outputs a strobe signal together with the read data to an external device, the strobe signal being output in response to the read enable signal and the read data being transferred from the read and write circuit, wherein a start of the output of the read data occurs after the strobe signal is toggled a predetermined number of times.

20. The memory system of claim 19, wherein the nonvolatile memory device and the controller constitute a solid state drive (SSD).

* * * * *